(12) United States Patent
Chen et al.

(10) Patent No.: US 11,830,796 B2
(45) Date of Patent: Nov. 28, 2023

(54) CIRCUIT SUBSTRATE, PACKAGE STRUCTURE AND METHOD OF MANUFACTURING THE SAME

(71) Applicant: Taiwan Semiconductor Manufacturing Company, Ltd., Hsinchu (TW)

(72) Inventors: Shih-Wei Chen, Hsinchu (TW); Yu-Chih Huang, Hsinchu (TW); Chih-Hao Chang, Hsinchu County (TW); Po-Chun Lin, Hsinchu (TW); Chun-Ti Lu, Hsinchu (TW); Chia-Hung Liu, Hsinchu (TW); Hao-Yi Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 43 days.

(21) Appl. No.: 17/213,102

(22) Filed: Mar. 25, 2021

(65) Prior Publication Data

US 2022/0310499 A1  Sep. 29, 2022

(51) Int. Cl.
*H01L 23/498* (2006.01)
*H01L 25/065* (2023.01)
(Continued)

(52) U.S. Cl.
CPC ...... *H01L 23/49822* (2013.01); *H01L 21/486* (2013.01); *H01L 21/4857* (2013.01);
(Continued)

(58) Field of Classification Search
CPC ......... H01L 23/49822; H01L 23/49838; H01L 23/5383; H01L 24/16; H01L 24/32; H01L 25/0655; H01L 25/0657; H01L 25/50; H01L 21/4857; H01L 2224/16235; H01L 2224/32237; H10B 80/00
(Continued)

(56) References Cited

U.S. PATENT DOCUMENTS

| 8,993,380 | B2 | 3/2015 | Hou et al. |
| 9,000,584 | B2 | 4/2015 | Lin et al. |
| 9,048,222 | B2 | 6/2015 | Hung et al. |
| 9,048,233 | B2 | 6/2015 | Wu et al. |

(Continued)

*Primary Examiner* — Jasmine J Clark
(74) *Attorney, Agent, or Firm* — JCIPRNET

(57) ABSTRACT

A circuit substrate includes a base substrate, a plurality of conductive vias, a first redistribution circuit structure, a second redistribution circuit structure and a semiconductor die. The plurality of conductive vias penetrate through the base substrate. The first redistribution circuit structure is located on the base substrate and connected to the plurality of conductive vias. The second redistribution circuit structure is located over the base substrate and electrically connected to the plurality of conductive vias, where the second redistribution circuit structure includes a plurality of conductive blocks, and at least one of the plurality of conductive blocks is electrically connected to two or more than two of the plurality of conductive vias, and where the base substrate is located between the first redistribution circuit structure and the second redistribution circuit structure. The semiconductor die is located over the base substrate and laterally arranged next to the second redistribution circuit structure.

20 Claims, 25 Drawing Sheets

(51) Int. Cl.
*H01L 21/48* (2006.01)
*H01L 23/538* (2006.01)
*H01L 23/00* (2006.01)
*H01L 25/00* (2006.01)

(52) U.S. Cl.
CPC .... *H01L 23/49838* (2013.01); *H01L 23/5383* (2013.01); *H01L 24/16* (2013.01); *H01L 24/32* (2013.01); *H01L 25/0655* (2013.01); *H01L 25/0657* (2013.01); *H01L 25/50* (2013.01); *H01L 2224/16235* (2013.01); *H01L 2224/32237* (2013.01)

(58) Field of Classification Search
USPC .......................................... 257/621, 734, 777
See application file for complete search history.

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2014/0102777 A1* | 4/2014 | Chen ................. H01L 23/49827 174/266 |
| 2021/0098636 A1* | 4/2021 | Tai ..................... H01L 31/0203 |

* cited by examiner

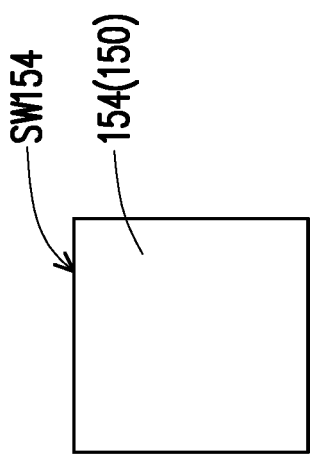
FIG. 15A
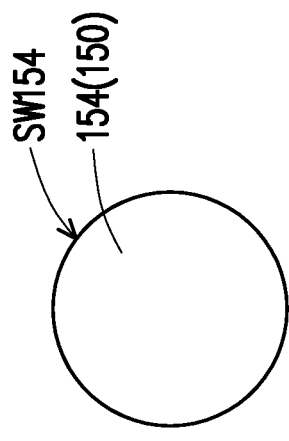
FIG. 15B
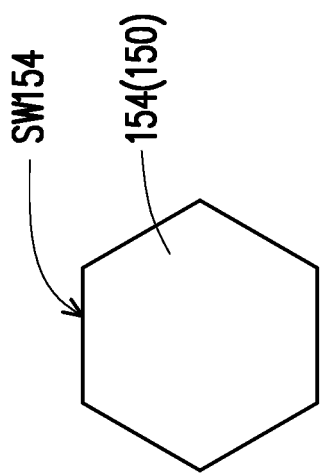
FIG. 15C
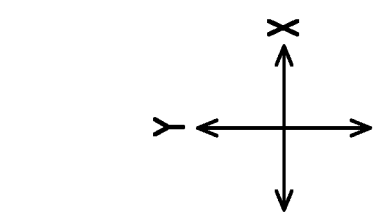
FIG. 15D
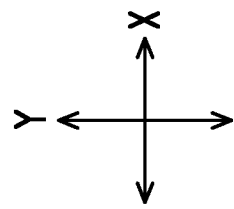
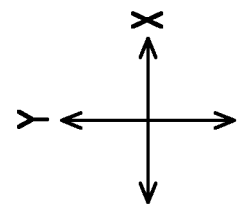

CIRCUIT SUBSTRATE, PACKAGE STRUCTURE AND METHOD OF MANUFACTURING THE SAME

BACKGROUND

Semiconductor devices and integrated circuits (ICs) are used in a variety of electronic applications, such as personal computers, cell phones, digital cameras, and other electronic equipment. For example, the semiconductor devices and ICs are typically manufactured on a single semiconductor wafer. The dies of the wafer may be processed and packaged with other semiconductor devices, dies or components at the wafer level or after wafer-sawing, and various technologies have been developed. Semiconductor processing for fabrications of the semiconductor devices and ICs continues to evolve towards increasing device-density, higher numbers of active devices (mainly transistors) of ever decreasing device dimensions.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15A through FIG. 15F are schematic plane views showing various embodiments of a metallization block of the disclosures.

DETAILED DESCRIPTION

Figure 1:
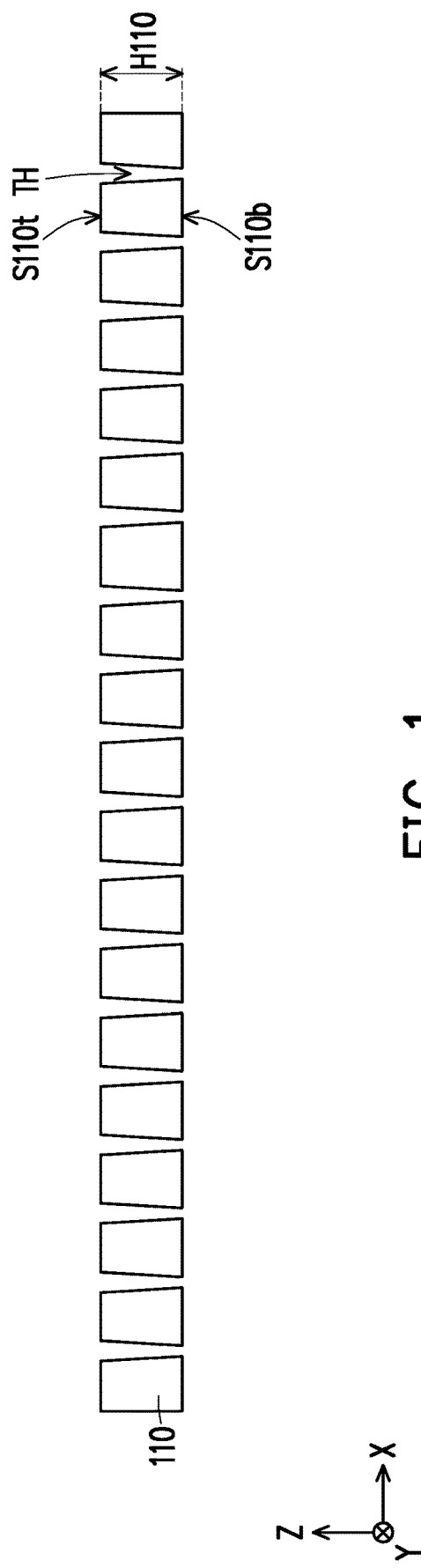
FIG. 1 through FIG. 12 are schematic cross-sectional views showing a method of manufacturing a circuit substrate in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A circuit substrate, a semiconductor package having the same and methods of manufacturing thereof are provided in accordance with various exemplary embodiments. Before addressing the illustrated embodiments specifically, certain advantageous features and aspects of the present disclosed embodiments will be addressed generally. The circuit substrate may be adopted for lowering the resistance of a semiconductor package and for increasing the heat dissipation capability of the semiconductor package. Described below is a circuit substrate with an integrated semiconductor die (or chip) along with a redistributing element, where the redistributing element is capable of providing horizontal and vertical electrical connections between/among a circuit of the circuit substrate and a circuit of an overlaying semiconductor component (e.g. a sub-package with other integrated semiconductor dies (or chips)). With such circuit substrate (e.g. serving as an interposer), the semiconductor component may be directly formed on the redistributing element of the circuit substrate to obtain a stack structure, without the use of solder balls. Correspondingly, the resulting stack structure of a semiconductor package has a smaller overall thickness, where its resistance is reduced while increasing the heat dissipation capability thereof. In addition, the resulting stack structure of the semiconductor package may further bonded to another substrate (such as a printed circuit board (PCB), a mother board, or the like) for external connections with other electrical components. The intermediate stages of forming the circuit substrate and/or semiconductor package are illustrated in accordance with some embodiments. Some variations of some embodiments are discussed. Throughout the various views and illustrative embodiments, like reference numbers are used to designate like elements.

FIG. 1 through FIG. 12 are schematic cross-sectional views showing a method of manufacturing a circuit substrate 100A in accordance with some embodiments of the disclosure. FIG. 13A is a schematic plane view illustrating a relative position of a semiconductor die and a redistribution circuit structure including a plurality of conductive blocks included in the circuit substrate 100A depicted in FIG. 12, where FIG. 1 through FIG. 12 are the cross-sectional views taken along a line BB depicted in FIG. 13A. FIG. 13B is a schematic plane view illustrating a relative position of a semiconductor die and a redistribution circuit structure including a plurality of conductive blocks included in a circuit substrate in accordance with some alternative embodiments of the disclosure. FIG. 14A through FIG. 14D are schematic cross-sectional views showing various embodiments of a conductive block CB indicated by a dotted box A depicted in FIG. 9. FIG. 15A through FIG. 15F are schematic plane views showing various embodiments of a metallization block MB.

In embodiments, the manufacturing method is part of a wafer level packaging process. It is to be noted that the process steps described herein cover a portion of the manufacturing processes used to fabricate a semiconductor package involving a semiconductor component such as a semiconductor die (or device/chip). The embodiments are intended to provide further explanations but are not used to limit the scope of the disclosure. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 22:
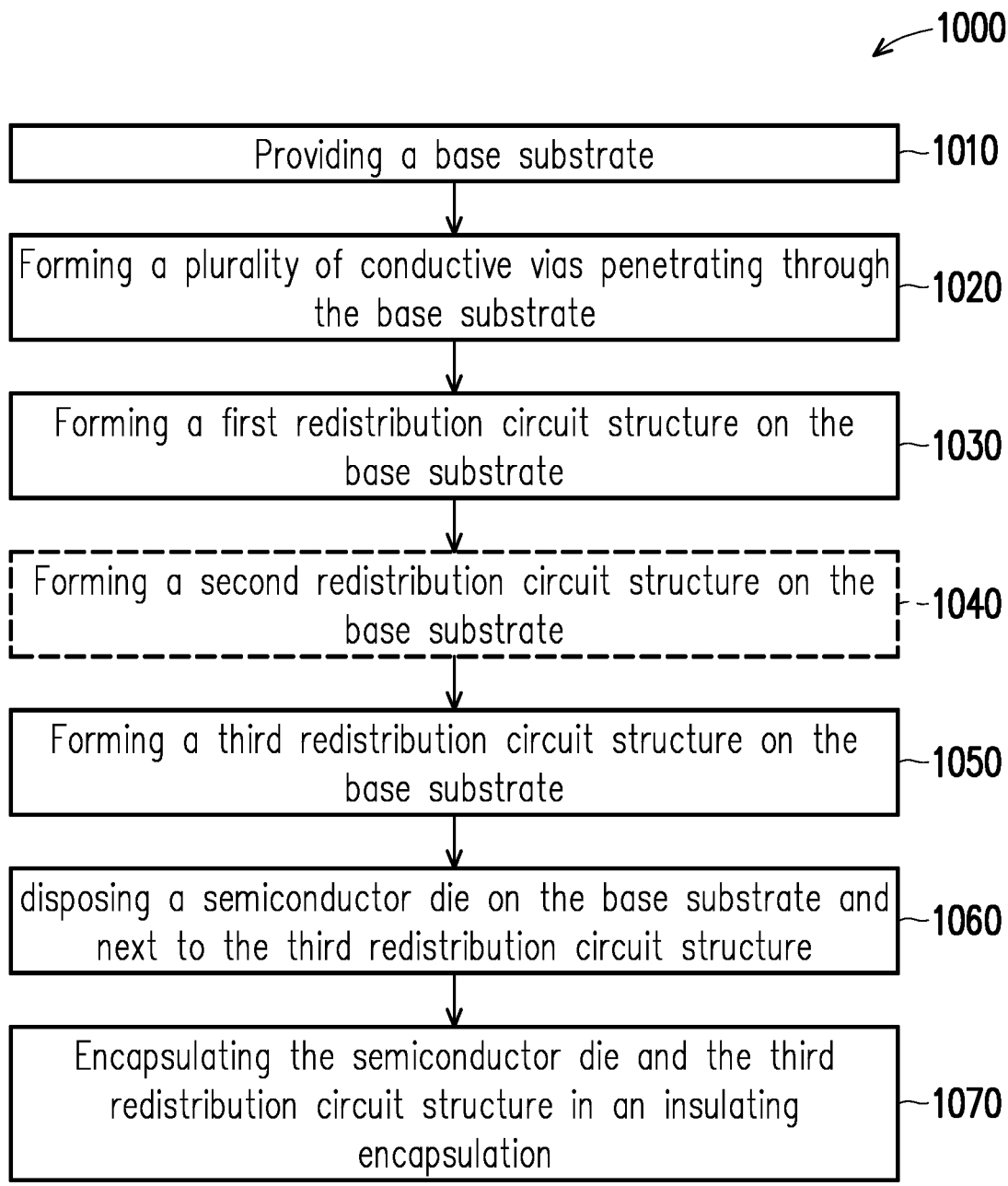
FIG. 22 is a flow chart illustrating a method of manufacturing a circuit substrate in accordance with some embodiments of the disclosure.

Referring to FIG. 1, in some embodiments, a base substrate 110 is provided, in accordance with a step 1010 of a method 1000 in FIG. 22. In some embodiments, the base substrate 110 includes a substrate with a suitable thermally conductive material having a thermal conductivity more than 30 W/(m·K). A material of the base substrate 110 may include $Al_2O_3$, AlN, or the like, or a combination thereof. For example, the base substrate 110 is a ceramic substrate. Alternatively, the material of the base substrate 110 may include Si, GaN, GaAs, SiC, or the like, or a combination thereof. For example, the base substrate 110 is a semiconductor substrate. Other substrates, such as a multi-layered or gradient substrate may also be used. As shown in FIG. 1, the base substrate 110 has a first main surface S110t and a second main surface S110b opposite to the first main surface S110t along a direction Z, where the first main surface S110t and the second main surface S110b extend along a direction X and a direction Y, for example. The direction X is different from the direction Y, and the direction X and the direction Y each are different from the direction Z. For example, the direction X is perpendicular to the direction Y, and the direction X and the direction Y each are perpendicular to the direction Z as shown in FIG. 1. In the disclosure, the direction Z may be referred to as a stacking direction, and an X-Y plane defined by the direction X and the direction Y may be referred to as a plane view or top view.

In some embodiment, along the direction Z, a thickness of the base substrate 110 is approximately ranging from 100 μm to 1000 μm. In some embodiments, if considering a top view along the direction Z, the base substrate 110 is in a wafer or panel form. The base substrate 110 may be in a form of wafer-size having a diameter of about 4 inches or more. The base substrate 110 may be in a form of wafer-size having a diameter of about 6 inches or more. The base substrate 110 may be in a form of wafer-size having a diameter of about 8 inches or more. Or alternatively, the base substrate 110 may be in a form of wafer-size having a diameter of about 12 inches or more. On the other hand, the base substrate 110 may be in a form of panel-size having a long axis of about 4 inches or more, about 6 inches or more, about 8 inches or more, about 12 inches or more, or any other suitable size. The disclosure is not limited thereto.

Continued on FIG. 1, in some embodiments, a plurality of through holes TH is formed in the base substrate 110. For example, the through holes TH extend along the direction Z and penetrate through the base substrate 110, where each through hole TH has two openings respectively at the first main surface S110t and the second main surface S110b. In some embodiments, the through holes TH are may be arranged in the form of a matrix, such as the N×N array or N×M array (N, M>0, N may or may not be equal to M) along the X-Y plane. The number of the through holes TH shown in FIG. 1 is for illustrative proposes only, and the disclosure is not limited thereto. The number of the through holes TH may be selected and designated based on the demand and design layout.

The through holes TH are, for example, formed by a laser drilling process. In some embodiments, if considering the through holes TH are holes with substantially round-shaped cross-section (from the top view on the X-Y plane), each of the through holes TH includes a slant sidewall (from the cross sectional view depicted in FIG. 1), where each of through holes TH has a top opening (at the first main surface S110t) having a top diameter and a bottom opening (at the second main surface S110b) having a bottom diameter, and the top diameter is greater than the bottom diameter. Alternatively, each of the through holes TH may include a vertical sidewall, where the top diameter may be substantially equal to the bottom diameter. Alternatively, the cross-sectional shape of the through holes TH on the X-Y plane is, for example, elliptical, oval, tetragonal, hexagonal, octagonal or any suitable polygonal shape. The disclosure is not limited thereto.

Figure 2:
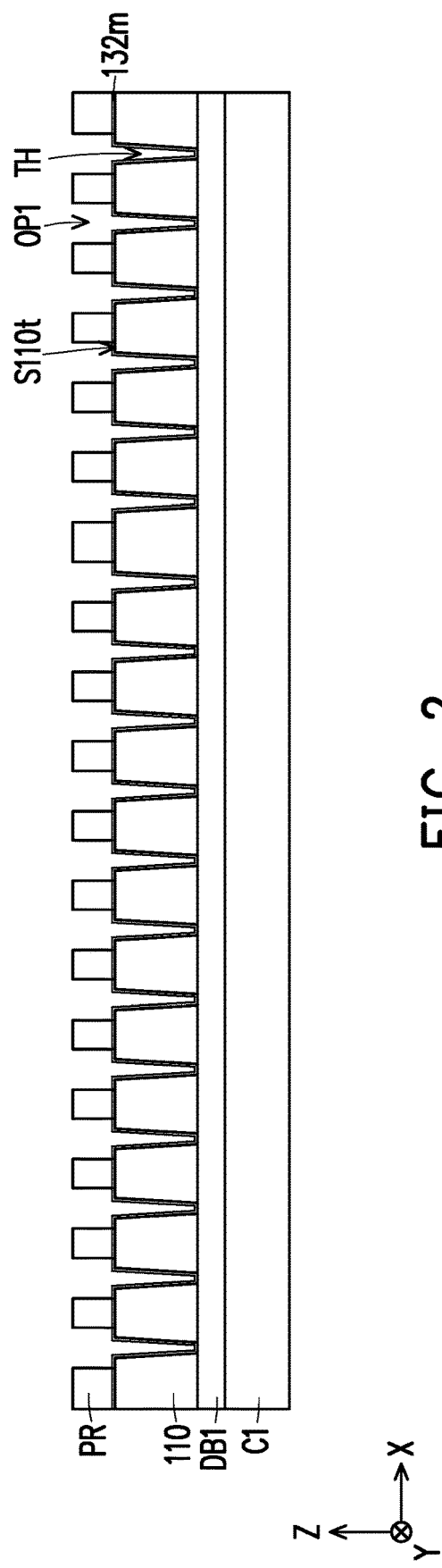

Referring to FIG. 2, in some embodiments, a seed layer 132m is formed over the base substrate 110. Prior to forming the seed layer 132m over the base substrate 110, a carrier C1 is provided and the base substrate 110 is then placed over the carrier C1, as shown in FIG. 2, in some embodiments. The carrier C1 may be a glass carrier or any suitable carrier for carrying the base substrate 110 during the manufacture. In some embodiments, the carrier C1 is coated with a debond layer DB1, as shown in FIG. 2. The material of the debond layer DB1 may be any material suitable for bonding and debonding the carrier C1 from the above layer(s) disposed thereon.

In some embodiments, the debond layer DB1 includes a dielectric layer made of a dielectric material including any suitable polymer-based dielectric material (such as benzocyclobutene (BCB), polybenzoxazole (PBO)). In an alternative embodiment, the debond layer DB1 includes a dielectric material layer made of an epoxy-based thermal-release material, which loses its adhesive property when heated, such as a light-to-heat-conversion (LTHC) release coating film. In a further alternative embodiment, the debond layer DB1 includes a dielectric material layer made of an ultraviolet (UV) glue, which loses its adhesive property when exposed to UV lights. The debond layer DB1 may be dispensed as a liquid and cured, or may be a laminate film laminated onto the carrier C1, or may be the like. The top surface of the debond layer DB1, which is opposite to a bottom surface contacting the carrier C1, may be levelled and may have a high degree of coplanarity. In certain embodiments, the debond layer DB1 is, for example, a LTHC layer with good chemical resistance, and such layer enables room temperature debonding from the carrier C1 by applying laser irradiation, however the disclosure is not limited thereto.

In some embodiments, the seed layer 132m is conformally and entirely formed over the base substrate 110 and extends into the through holes TH formed in the base substrate 110 to be in contact with the top surface of the debond layer DB1. In other words, the seed layer 132m penetrates through the base substrate 110, and the sidewalls of the through holes and the top surface of the debond layer DB1 exposed by the through holes TH are completely covered by the seed layer 132m.

In some embodiments, the seed layer 132m is conformally formed over the carrier 112 in a manner of a blanket layer made of metal or metal alloy materials, the disclosure is not limited thereto. In some embodiments, the seed layer 132m are referred to as a metal layer, which may be a single layer or a composite layer comprising a plurality of sub-layers formed of different materials. In some embodiments, the seed layer 132m include titanium, copper, molybdenum, tungsten, titanium nitride, titanium tungsten, combinations thereof, or the like. For example, the seed layer 132m may include a titanium layer and a copper layer over the titanium layer. The seed layer 132m may be formed using, for example, sputtering, physical vapor deposition (PVD). or the like.

Continued on FIG. 2, in some embodiments, a resist layer PR is formed on the seed layer 132m, where the resist layer PR includes at least one opening OP1. For example, as shown in FIG. 2, a plurality of openings OP1 are formed in the resist layer PR. In some embodiments, portions of the seed layer 132m are exposed by the openings OP1 formed in the resist layer PR, respectively. For example, positioning locations of the openings OP1 are corresponding to (e.g. overlapped with) positioning locations of the through holes TH, where the openings OP1 are spatially communicated with the through holes TH. That is, the number of the openings OP1 corresponds to the number of the through holes TH for forming conductive structure(s) (such as a conductive pillar, a conductive via, a conductive trace, or a conductive segment). In one embodiment, the resist layer PR may be formed by coating and photolithography processes or the like; however, the disclosure is not limited thereto. In some embodiments, a material of the resist layer PR, for example, includes a positive resist material or a negative resist material, that is suitable for a patterning process such as a photolithography process with a mask or a mask-less photolithography process (for instance, an electron-beam (e-beam) writing or an ion-beam writing). In the disclosure, the resist layer PR is referred to as a photoresist layer.

Figure 3:
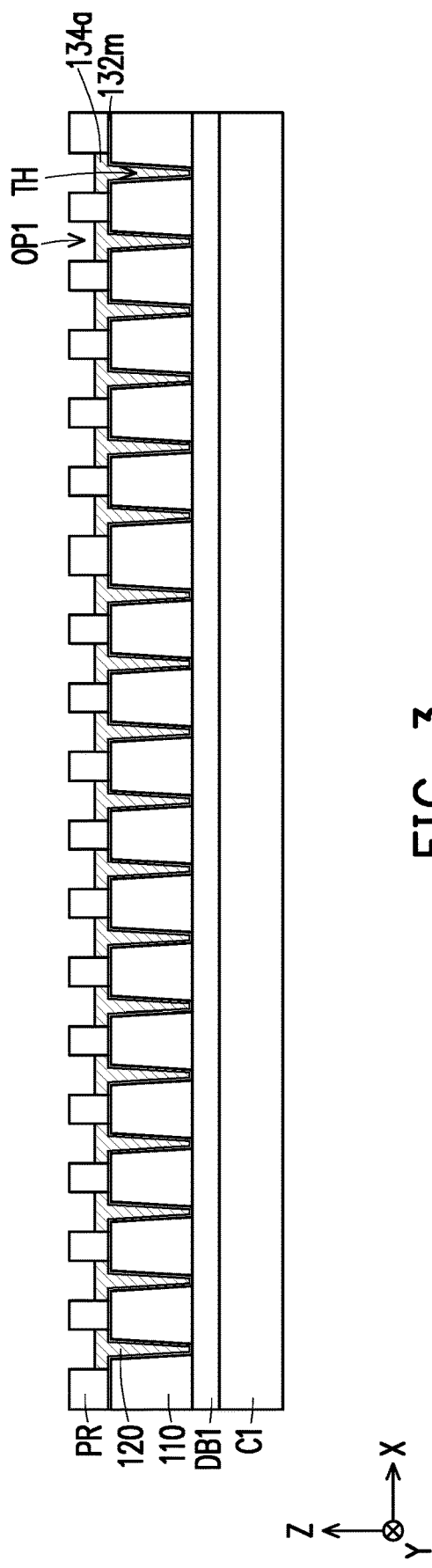

Referring to FIG. 3, in some embodiments, a plurality of conductive vias 120 are formed in the base substrate 110, in accordance with a step 1020 of FIG. 22. In some embodiments, during forming the conductive vias 120, a metallization layer 134 are simultaneously formed on the based substrate 110 and the conductive vias 120, where the metallization layer 134 is electrically connected to the conductive vias 120. For example, as shown in FIG. 3, the metallization layer 134 includes a plurality of metallization patterns (e.g. conductive segments or traces) respectively connecting to the conductive vias 120. That is, the conductive vias 120 and the metallization layer 134 may be formed integrally.

For example, but not limited to the disclosure, by filling a conductive material into the through holes TH formed in the base substrate 110 and the openings OP1 formed in the resistor layer PR over the seed layer 132m, the conductive vias 120 are formed over a portion of the seed layer 132m located in the through holes TH formed in the base substrate 110, and the metallization layer 134 is formed over a portion of the seed layer 132m located in the openings OP1 formed in the resistor layer PR. With such, the metallization layer 134 may include a plurality of conductive patterns or segments respectively physically and electrically connecting to the conductive vias 120. In one embodiment, the conductive material is formed by plating process, such as electroplating or electroless plating. In some embodiments, the metallization layer 134 includes patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 4:
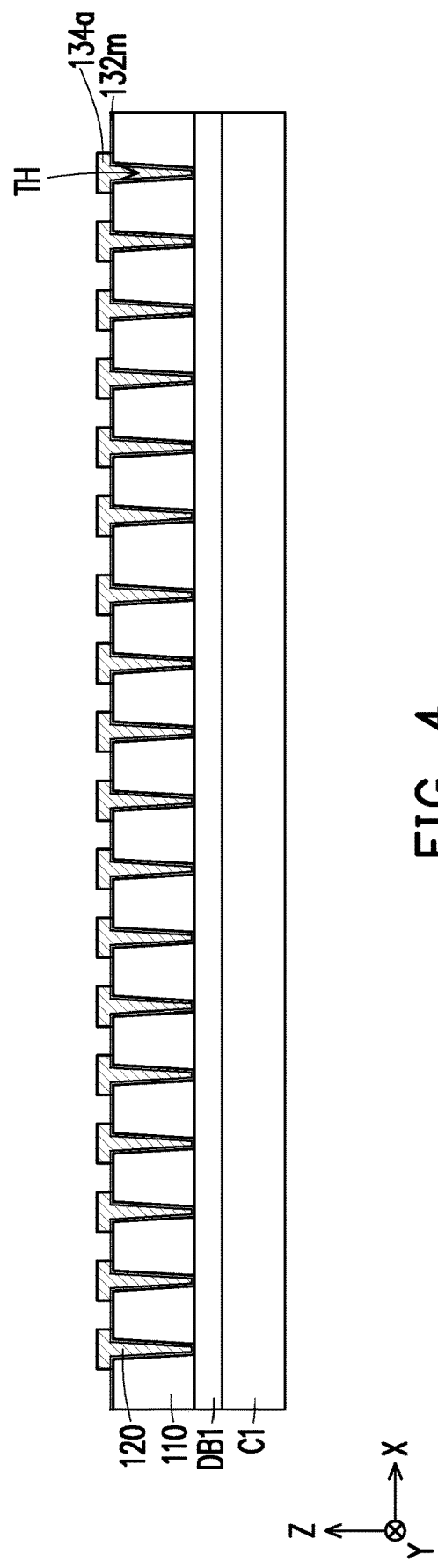

Referring to FIG. 4, in some embodiments, after the formation of the conductive vias 120 and the metallization layer 134, the resist layer PR is removed. For example, the resist layer PR may be removed by acceptable ashing process and/or photoresist stripping process, such as using an oxygen plasma or the like. As illustrated in FIG. 4, portions of the seed layer 132m not covered by the conductive vias 120 and the metallization layer 134 are exposed.

Figure 5:
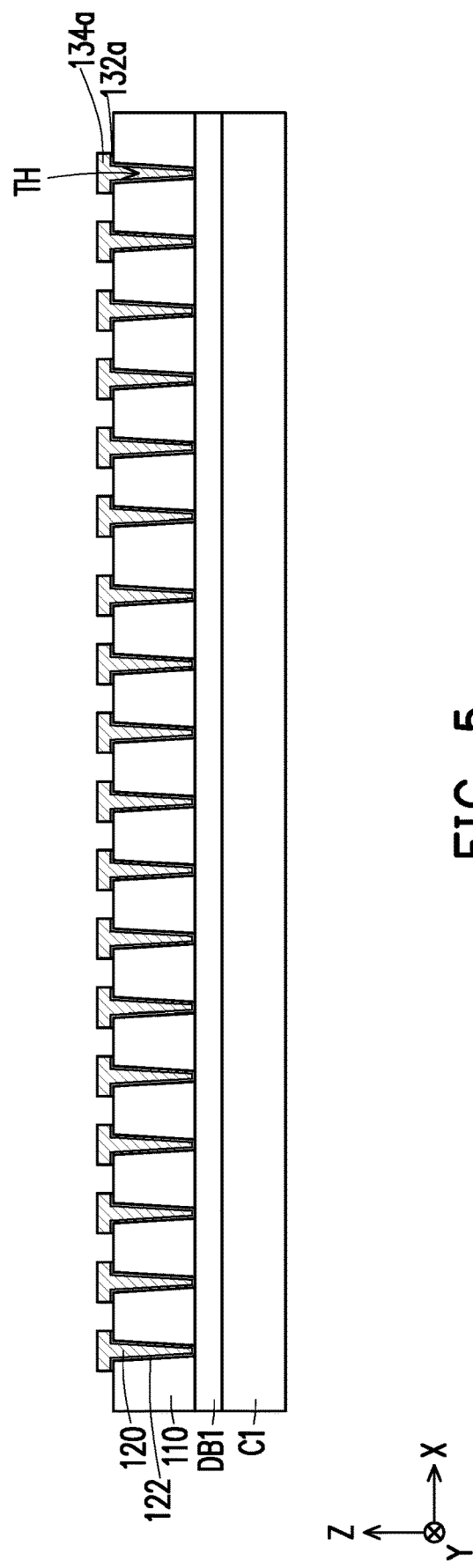

Referring to FIG. 5, in some embodiments, the seed layer 132m is patterned to form a seed layer 122 in the through holes TH formed in the base substrate 110 and to form a seed layer 132 above the base substrate 110. For example, the seed layer 122 and the seed layer 132 are connected to one another. In some embodiments, the seed layer 132m is patterned by using the metallization layer 134 as an etching mask to remove the portions of the seed layer 132m exposed by the conductive vias 120 and the metallization layer 134 to simultaneously form the seed layers 122 and 132. For example, the etching process may be a dry etching process, a wet etching process, or a combination thereof; the disclosure is not limited thereto. The seed layers 122 and 132 are formed integrally in the disclosure.

In some embodiments, the seed layers 122 and 132 each include a plurality of conductive patterns or segments, where one conductive pattern or segment of the seed layer 122 is physically and electrically connected to a respective one conductive via 120 overlying thereto, and one conductive pattern or segment of the seed layer 132 is physically and electrically connected to one conductive pattern or segment of the metallization layer 134 overlying thereto. In some embodiments, as shown in FIG. 5, sidewalls of the conductive pattern or segment of the metallization layer 134 are correspondingly, substantially aligned with sidewalls of conductive pattern or segment of the seed layer 132. For example, the conductive vias 120 are separated from the base substrate 110 through the seed layer 122. In alternative embodiments, a dielectric liner (not shown) (e.g., silicon nitride, an oxide, a polymer, a combination thereof, etc.) may be further optionally formed between the seed layer 122 and the base substrate 110.

However, the disclosure is not limited thereto. Alternatively, the conductive vias 120 and the metallization layer 134 may be formed by, but not limited to, forming a blanket layer of conductive material over the structure depicted in FIG. 2 to completely cover the seed layer 132m to form the conductive vias 120 in the through holes TH, and then patterning the conductive material blanket layer over the base substrate 100 to form the metallization layer 134. The conductive material may be copper, copper alloy, aluminum, aluminum alloy, or combinations thereof, which is formed by deposition or sputtering. With such alternative embodiments, the resist layer PR is omitted.

Figure 6:
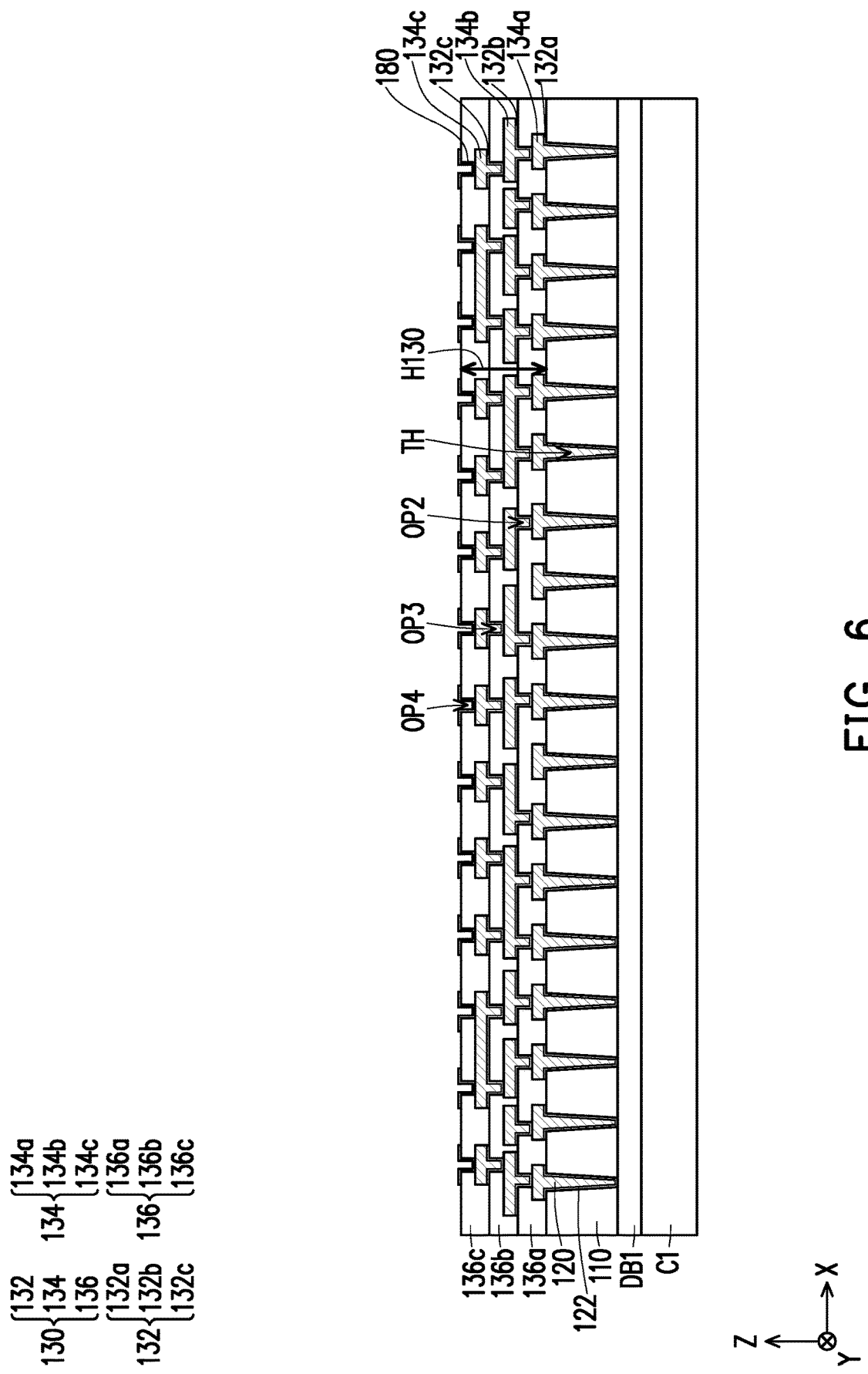

Referring to FIG. 6, in some embodiments, a redistribution circuit structure 130 is formed on the first main surface S110t of the base substrate 110, in accordance with a step 1030 of FIG. 22. In some embodiments, as shown in FIG. 6, the redistribution circuit structure 130 includes one or more than one seed layer 132 (e.g. the seed layer 132a, a seed layer 132b, and a seed layer 132c), one or more than one metallization layer 134 (e.g. the metallization layer 134a, a metallization layer 134b, and a metallization layer 134c), and one or more than one dielectric layer 136 (e.g. a dielectric layer 136a, a dielectric layer 136b, and a dielectric layer 136c). However, in the disclosure, the numbers of layers of the seed layers 132, the metallization layers 134, and the dielectric layers 136 are not limited to what is depicted in FIG. 6, and may be selected or designated based on the demand and/or design layout.

In some embodiments, one seed layer 132, one metallization layer 134 and one dielectric layer 136, are collectively referred to as one build-up layer of the redistribution circuit structure 130. In some embodiments, along the direction Z, the build-up layer involving the seed layer 132a, the metallization layer 134a and the dielectric layer 136a is referred to as a first build-up layer, which is formed on and stacked on the base substrate 110 and is electrically connected to the conductive vias 120. In some embodiments, along the direction Z, the build-up layer involving the seed layer 132b, the metallization layer 134b and the dielectric layer 136b is referred to as a second build-up layer, which is formed and stacked on the first build-up layer and is electrically connected to the conductive vias 120 through the first build-up layer. In some embodiments, along the direction Z, the build-up layer involving the seed layer 132c, the metallization layer 134c and the dielectric layer 136c is referred to as a third build-up layer, which is formed and stacked on the second build-up layer and is electrically connected to the conductive vias 120 through the first and second build-up layers.

The metallization layers (e.g. 134a, 134b and 134c) of the redistribution circuit structure 130 may have identical sizes (e.g. line width and line thickness), in one embodiment. However, based on the demand and/or design layout, the sizes of the metallization layers (e.g. 134a, 134b and 134c) included in the redistribution circuit structure 130 may different from one another (e.g. in line width and line thickness). For example, the size of the metallization layer 134a is greater than or substantially equal to the size of the metallization layer 134b, while the size of the metallization layer 134b is greater than or substantially equal to the size of the metallization layer 134c. The disclosure is not limited thereto.

The redistribution circuit structure 130 may be formed by, but not limited to, forming the seed layer 132a as described in FIG. 2 through FIG. 5; forming the metallization layer 134a as described in FIG. 3; forming the dielectric layer 136a covering the metallization layer 134a and having a plurality of openings OP2 exposing portions of the metallization layer 134a; forming the seed layer 132b over the dielectric layer 136a and extending into the openings OP2 for electrically connecting the metallization layer 134a; forming the metallization layer 134b on the seed layer 132b; forming the dielectric layer 136b covering the metallization layer 134b and having a plurality of openings OP3 exposing portions of the metallization layer 134b; forming the seed layer 132c over the dielectric layer 136b and extending into the openings OP3 for electrically connecting the metallization layer 134b; forming the metallization layer 134c on the seed layer 132c; and forming the dielectric layer 136c covering the metallization layer 134c and having a plurality of openings OP4 exposing portions of the metallization layer 134c.

In some embodiments, the dielectric layer 136a is formed by, but not limited to, forming a blanket layer of dielectric material over the structure depicted in FIG. 5 to completely cover the metallization layer 134a and the base substrate 110 exposed by the metallization layer 134a, and patterning the dielectric material blanket layer to form the dielectric layer 136a. In some embodiments, during patterning the dielectric material blanket layer to form the dielectric layer 136a, the openings OP2 are formed in the dielectric material blanket layer to form the dielectric layer 136a. In other words, the metallization layer 134a are partially, accessibly revealed by the dielectric layer 136a through the openings OP1 for electrical connections with later-formed components (e.g. the second build-up layer).

In some embodiments, the material of the dielectric layers 136a may be polyimide, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layer 136a may be formed by suitable fabrication techniques such as spin-on coating, chemical vapor deposition (CVD), (e.g. plasma-enhanced chemical vapor deposition (PECVD)), or the like.

The formation and material of each of the seed layers 132b and 132c are substantially identical or similar to the forming process and materials of the seed layer 132a as described in FIG. 2 through FIG. 5, the formation and material of each of the metallization layers 134b and 134c are substantially identical or similar to the forming process and materials of the seed layer 134a as described in FIG. 3, the formation and material of each of the dielectric layers 136b and 136c are substantially identical or similar to the forming process and materials of the seed layer 136a as above, and thus are not repeated therein for brevity. As illustrated in FIG. 6, a thickness H130 of the redistribution circuit structure 130 is approximately ranging from 30 µm to 500 µm. In addition, a thickness of each of the metallization layers 134 is approximately ranging from 2 µm to 100 µm.

After the formation of the redistribution circuit structure 130, a plurality of an under-ball metallurgy (UBM) patterns 180 are sequentially formed over the redistribution circuit structure 130 for electrical connections with later-formed components (such as conductive terminals, semiconductor devices, or a combination thereof), for example. In some embodiments, as shown in FIG. 6, the UBM patterns 180 each are located on an outermost surface of the dielectric layer 136c, where the UBM patterns 180 respectively extend into the openings OP4 formed in the dielectric layer 136c to physically contact the portions of the metallization layer 134c exposed by the openings OP4. Due to the UBM patterns 180, the adhesive strength between the later-formed components and the redistribution circuit structure 130 is enhanced.

In some embodiments, the UBM patterns 180 are directly located on the portions of the metallization layer 134c exposed by the openings OP4 formed in the dielectric layer 136c. As shown in FIG. 6, in some embodiments, the UBM patterns 180 are electrically connected to the redistribution circuit structure 130. The UBM patterns 180 may be a metal layer, which may include a single layer or a composite layer comprising a plurality of sub-layers formed of different materials. In some embodiments, the materials of the UBM patterns 180 includes copper, nickel, titanium, molybdenum, tungsten, titanium nitride, titanium tungsten, or alloys thereof or the like, and may be formed by an electroplating process, for example. The UBM patterns 180 each may include titanium layer and a copper layer over the titanium layer. In some embodiments, the UBM patterns 180 are formed using, for example, sputtering, PVD, or the like. The shape the UBM patterns 180 are not limited in this disclosure. The number of the UBM patterns 180 is not limited in this disclosure, and corresponds to the number of the portions of the metallization layer 134c exposed by the openings OP4 formed in the dielectric layer 136c.

In alternative embodiments, the UBM patterns 180 are optionally omitted based on demand and/or design layout, and the portions of the metallization layer 134c exposed by the openings OP4 formed in the dielectric layer 136c underlying the later-formed or later-disposed conductive elements (e.g. conductive terminals for external connections) function as under-ball metallurgy (UBM) layers. In a further alternative embodiment, besides the formation of the UBM patterns 180, additional conductive pads (not shown) are also formed for mounting semiconductor passive components/devices (not shown) thereon. The semiconductor passive components/devices may be integrated passive devices (IPDs) or surface mount devices (SMDs). The materials of the conductive pads and the UBM patterns 180 may be the same. Alternatively, the material of the UBM patterns 180 may be different from the material of the conductive pads. The disclosure is not limited thereto.

Figure 7:
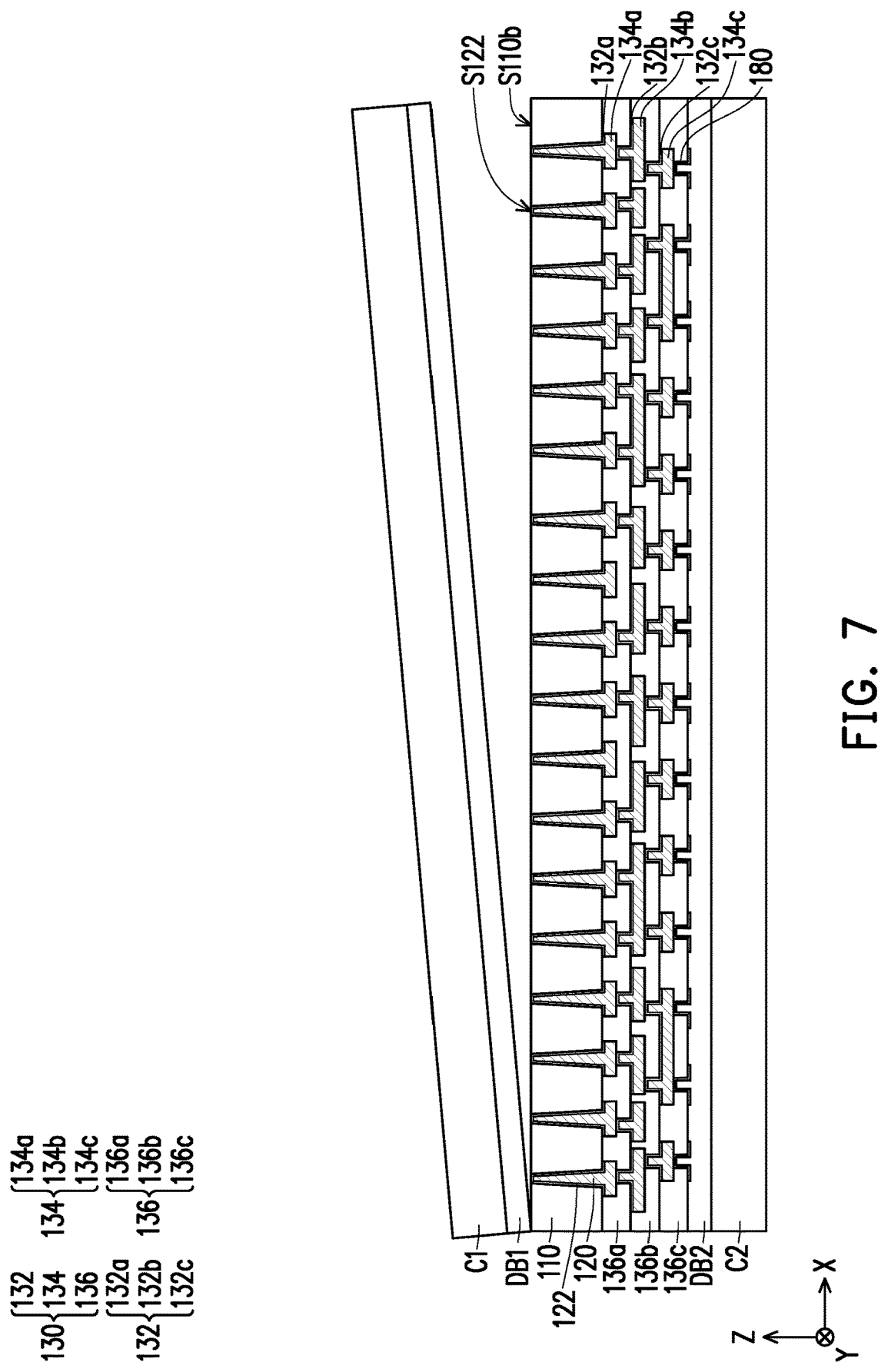

Referring to FIG. 7, in some embodiments, the structure depicted in FIG. 6 is flipped (turned upside down), where the redistribution circuit structure 130 and the UBM patterns 180 are placed on a carrier C2 provided with a debond layer DB2. The material of the carrier C2 may be the same or similar to the material of the carrier C1, in some embodiments, thus may not be repeated herein. As shown in FIG. 7, the redistribution circuit structure 130 is placed on the debond layer DB2 and portions of the UBM patterns 180 are embedded in the debond layer DB2 to ensure the position of the flipped structure. The material of the debond layer DB2 may be the same or similar to the material of the debond layer DB1. In certain embodiments, the material of the debond layer DB2 may include a polymer film having sufficient elasticity to allow the UBM patterns 180 being embedded therein.

Continued on FIG. 7, in some embodiments, after the redistribution circuit structure 130 and the UBM patterns 180 are placed on the carrier C2, the carrier C1 is debonded from the second main surface S110b of the base substrate 110. In some embodiments, the base substrate 110 is easily separated from the carrier C1 due to the debond layer DB1, and the second main surface S110b of the base substrate 110 and surfaces S122 of the seed layer 122 on the conductive vias 120 are exposed. In some embodiments, the carrier C1 is detached from the second main surface S110b of the base substrate 110 through a debonding process, and the carrier C1 and the debond layer DB1 are removed. In one embodiment, the debonding process is a laser debonding process.

Figure 8:
Figure 8:
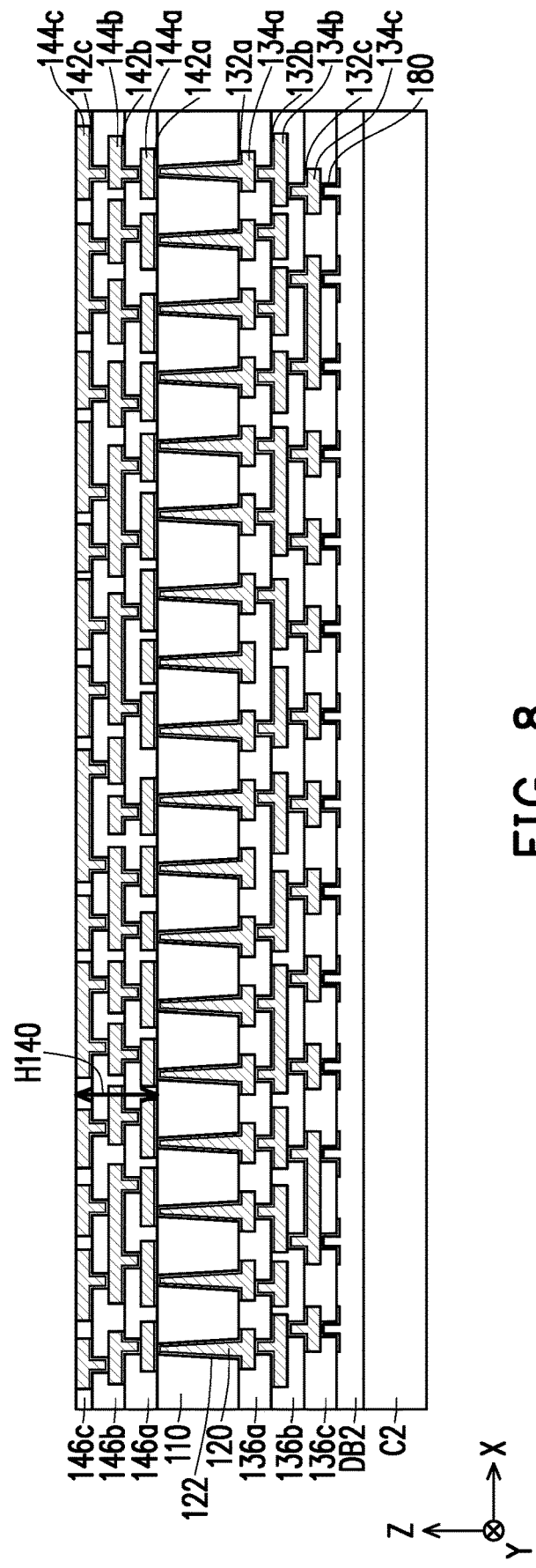

Referring to FIG. 8, in some embodiments, a redistribution circuit structure 140 is formed on the second main surface S110b of the base substrate 110, in accordance with a step 1040 of FIG. 22. In some embodiments, as shown in FIG. 8, the redistribution circuit structure 140 includes one or more than one seed layer 142 (e.g. the seed layer 142a, a seed layer 142b, and a seed layer 142c), one or more than one metallization layer 144 (e.g. the metallization layer 144a, a metallization layer 144b, and a metallization layer 144c), and one or more than one dielectric layer 146 (e.g. a dielectric layer 146a, a dielectric layer 146b, and a dielectric layer 146c). However, in the disclosure, the numbers of layers of the seed layers 142, the metallization layers 144, and the dielectric layers 146 are not limited to what is depicted in FIG. 8, and may be selected or designated based on the demand and/or design layout. The formations and material of the redistribution circuit structure 140 are substantially identical or similar to the forming process and material of the redistribution circuit structure 130 as described in FIG. 6, and thus are not repeated herein for brevity.

In some embodiments, one seed layer 142, one metallization layer 144 and one dielectric layer 146, are collectively referred to as one build-up layer of the redistribution circuit structure 140. In some embodiments, along the direction Z, the build-up layer involving the seed layer 142a, the metallization layer 144a and the dielectric layer 146a is referred to as a first build-up layer of the redistribution circuit structure 140, where the first build-up layer is formed on and stacked on the base substrate 110 and is electrically connected to the conductive vias 120. In some embodiments, along the direction Z, the build-up layer involving the seed layer 142b, the metallization layer 144b and the dielectric layer 146b is referred to as a second build-up layer of the redistribution circuit structure 140, where the second build-up layer of the redistribution circuit structure 140 is formed and stacked on the first build-up layer of the redistribution circuit structure 140 and is electrically connected to the conductive vias 120 through the first build-up layer of the redistribution circuit structure 140. In some embodiments, along the direction Z, the build-up layer involving the seed layer 142c, the metallization layer 144c and the dielectric layer 1436c is referred to as a third build-up layer of the redistribution circuit structure 140, where the third build-up layer is formed and stacked on the second build-up layer of the redistribution circuit structure 140 and is electrically connected to the conductive vias 120 through the first and second build-up layers of the redistribution circuit structure 140.

The metallization layers (e.g. 144a, 144b and 144c) of the redistribution circuit structure 140 may have identical sizes (e.g. line width and line thickness), in one embodiment. However, based on the demand and/or design layout, the sizes of the metallization layers (e.g. 144a, 144b and 144c) included in the redistribution circuit structure 140 may different from one another (e.g. in line width and line thickness). For example, the size of the metallization layer 144a is greater than or substantially equal to the size of the metallization layer 144b, while the size of the metallization layer 144b is greater than or substantially equal to the size of the metallization layer 144c. The disclosure is not limited thereto. In some embodiments, a thickness H140 of the redistribution circuit structure 140 is approximately ranging from 0 μm to 200 μm. That is, for example, as shown in FIG. 8, the thickness H140 of the redistribution circuit structure 140 is greater than 0 μm and is greater than or substantially equal to 200 μm. For another example, the redistribution circuit structure 140 is omitted (e.g. H140=0). In addition, a thickness of each of the metallization layers 144 is approximately ranging from 2 μm to 100 μm. In some embodiments, the thickness H140 of the redistribution circuit structure 140 is less than the thickness H130 of the redistribution circuit structure 130, where a warpage control is achieved as a semiconductor package is later formed on the circuit substrate 100A.

Figure 9:
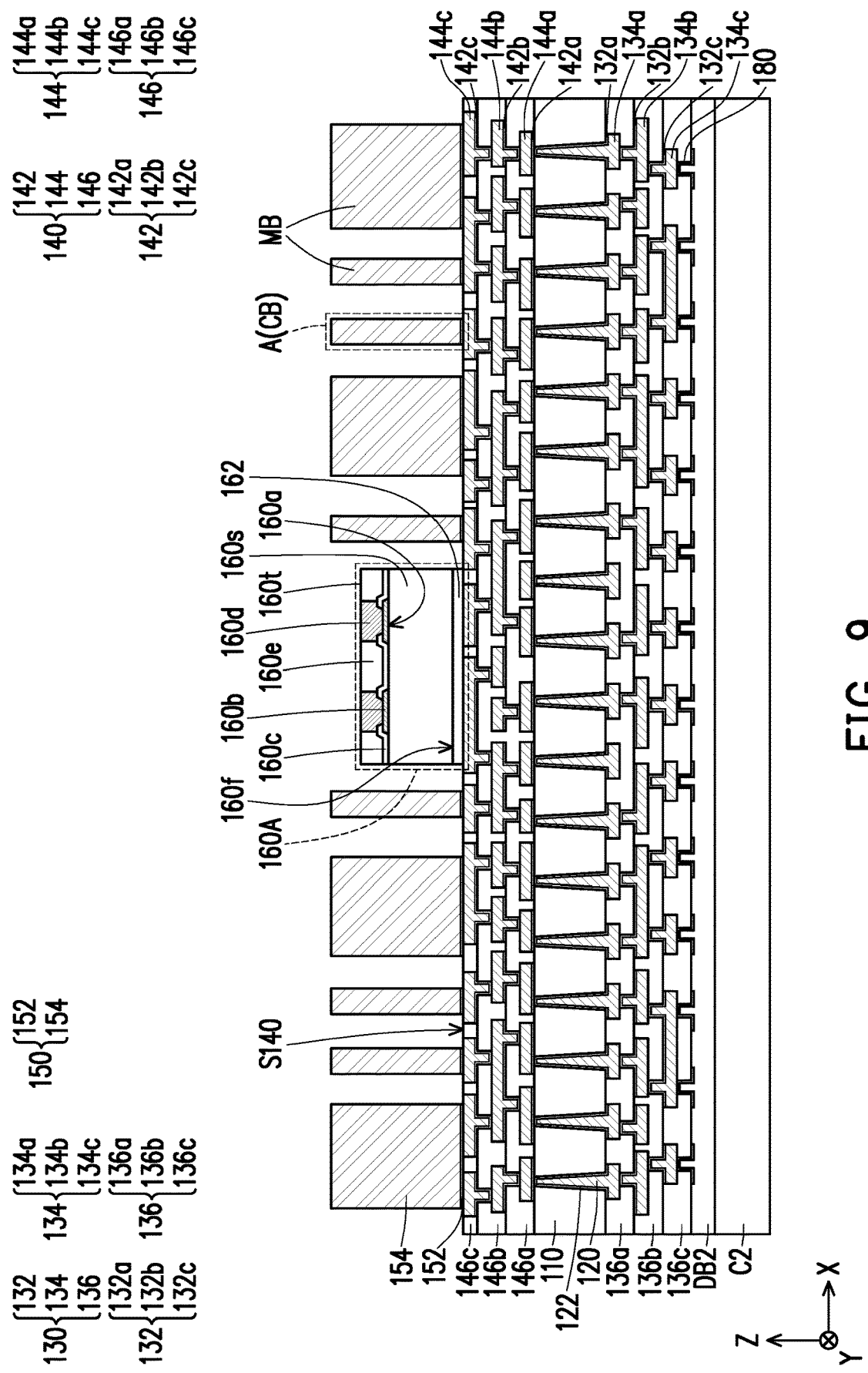

Referring to FIG. 9, in some embodiments, a redistribution circuit structure 150 is formed on the base substrate 110, in accordance with a step 1050 of FIG. 22. For example, the redistribution circuit structure 150 is formed on a surface S140 (e.g. an outermost surface of the dielectric layer 146c) of the redistribution circuit structure 140 over the second main surface S110b of the base substrate 110, where the redistribution circuit structure 140 is located between the base substrate 110 and the redistribution circuit structure 150, along the direction Z. In some embodiments, the redistribution circuit structure 150 is electrically connected to the conductive vias 120 embedded in the base substrate 110 through the redistribution circuit structure 140, and is electrically connected to the redistribution circuit structure 140 through the redistribution circuit structure 140 and the conductive vias 120 embedded in the base substrate 110.

In some embodiments, as shown in FIG. 9, the redistribution circuit structure 150 includes one seed layer 152 and one metallization layer 154. For example, the metallization layer 154 includes a plurality of conductive patterns or segments, and the seed layer 152 includes a plurality of conductive patterns or segments each underlying a respective one of the conductive patterns or segments of the metallization layer 154. The formations and material of the seed layer 152 are substantially identical or similar to the forming process and material of the seed layer 132a as described in FIG. 2 through FIG. 5, the formations and material of the metallization layer 154 are substantially identical or similar to the forming process and material of the metallization layer 134a as described in FIG. 3, and thus are not repeated herein for brevity.

In the disclosure, each of the conductive patterns or segments of the metallization layer 154 is referred to as one metallization block MB, and one of the conductive patterns or segments of the seed layer 152 and one of the conductive patterns or segments of the metallization layer 154 are collectively referred to as one conductive block CB (indicated by the dotted box A) of the redistribution circuit structure 150. For example, each metallization block MB of the redistribution circuit structure 150 is a metal block such as a Cu block or an Al block. For example, a thickness T152 of the seed layer 152 is approximately ranging from 0.3 μm to 5 μm. For example, a thickness T154 of the metallization blocks MB (e.g. the metallization layer 154) is approximately ranging from 70 μm to 300 μm.

Figure 14A:
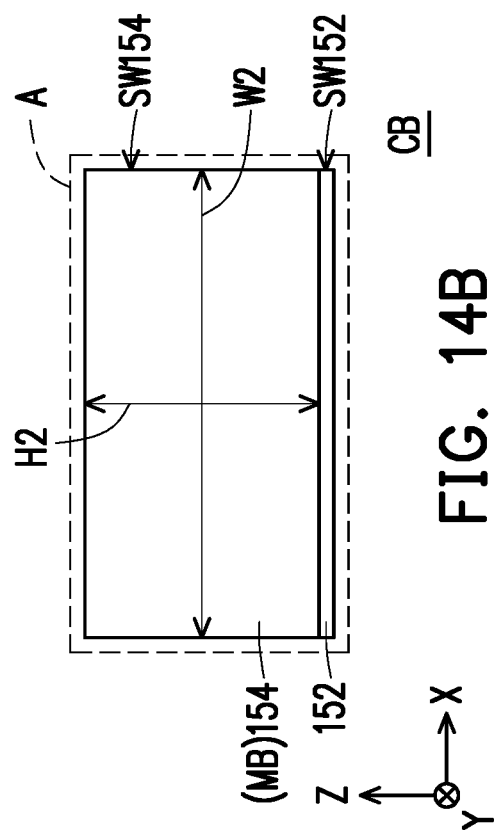
FIG. 14A through FIG. 14D are schematic cross-sectional views showing various embodiments of a conductive block of the disclosures.
Figure 14B:
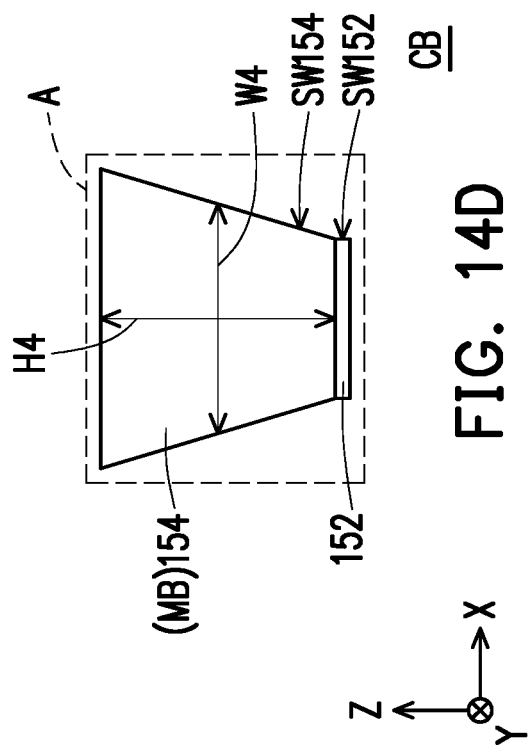
Figure 14C:
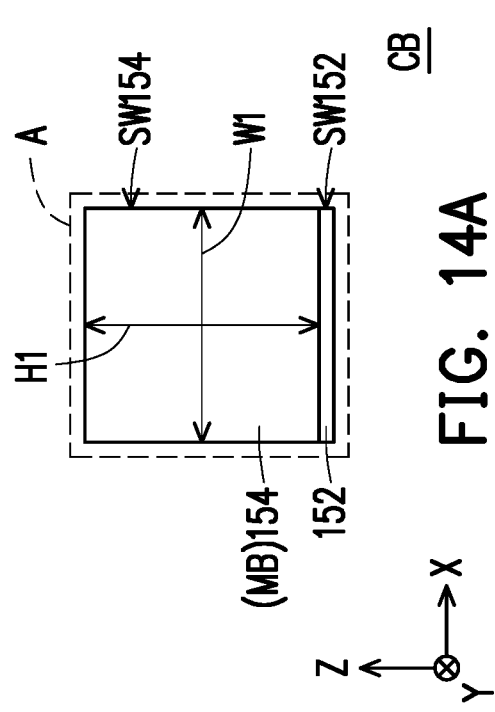
Figure 14D:
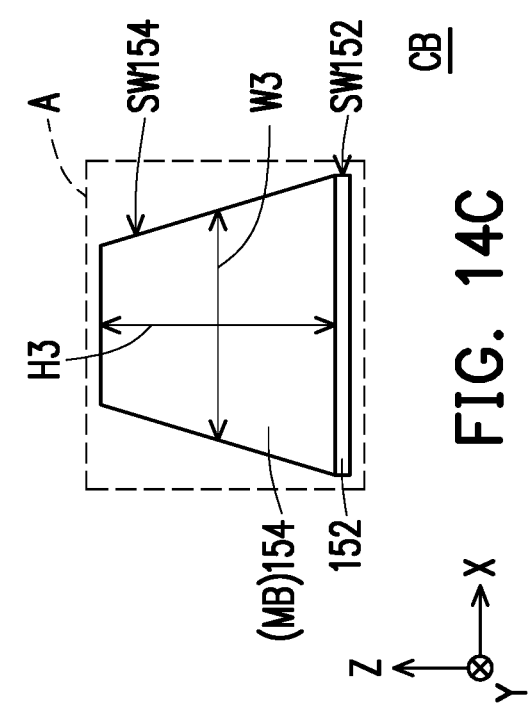

In some embodiments, along the direction Z, a shape of a cross-section of one metallization block MB included in the conductive block CB is a square shape (FIG. 14A), a rectangular shape (FIG. 14B), a trapezoidal shape (FIG. 14C), or an upside-down trapezoidal shape (FIG. 14D). In one embodiment, as shown in the cross-section of FIG. 14A, the metallization block MB has a height H1 substantially equal to a width W1, where the height H1 and the width W1, dependently, are constant. In an alternative embodiment, in the cross-section of FIG. 14B, the metallization block MB has a height H2 being less than a width W2, where the height H1 and the width W1, independently, are constant. Or, the height H2 may be greater than the width W2. In a further alternative embodiment, as shown in the cross-section of FIG. 14C, the metallization block MB has a height H3 and a width W3, where the height H3 is constant, and the width W3 varies along the direction Z. For example, the width W3 increases as getting closer to the seed layer 152 along the direction Z. In a yet further alternative embodiment, as shown in the cross-section of FIG. 14D, the metallization block MB has a height H4 and a width W4, where the height H4 is constant, and the width W4 varies along the direction Z. For example, the width W4 decreases as getting closer to the seed layer 152 along the direction Z. In some embodiments, a sidewall SW152 of the seed layer 152 is substantially aligned with a sidewall SW154 of the metallization block MB overlying thereto in the direction Z, see FIG. 14A and FIG. 14B. Alternatively, a sidewall SW152 of the seed layer 152 may not be substantially aligned with a sidewall SW154 of the metallization block MB overlying thereto in the direction Z, see FIG. 14C and FIG. 14D. In the disclosure, the height H1 through the height H4 are referred to as the thickness T154. In one embodiment, the width W1 though the width W4 are independently approximately ranging from 10 μm to 500 μm.

Figure 15E:
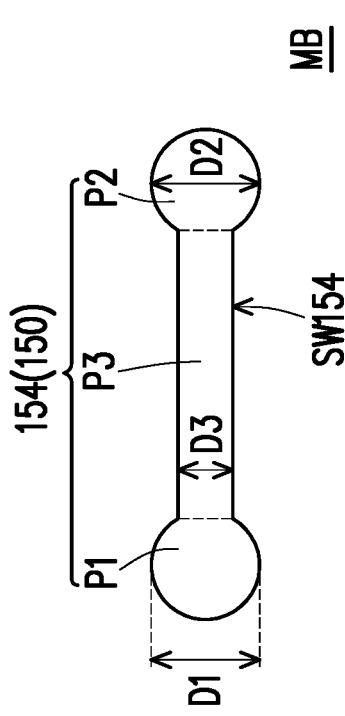
Figure 15F:
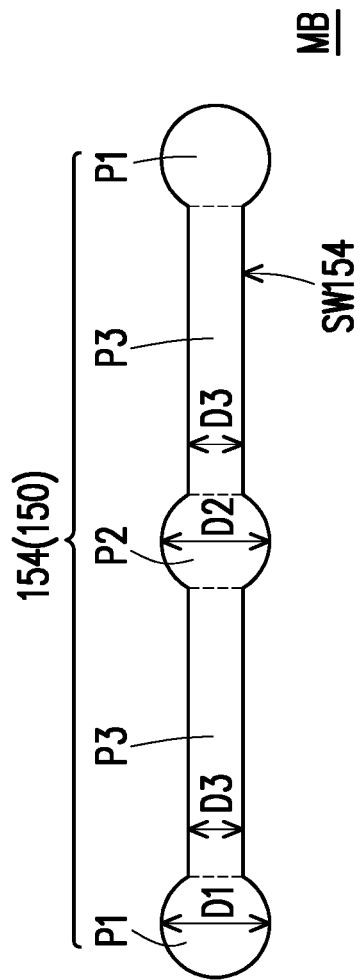

In some embodiments, along the X-Y plane, a shape of a top view of one metallization block MB is a circular shape (such as a circle as shown in FIG. 15A, an oval, an ellipse or the like), a tetragonal shape (e.g., a square as shown in FIG. 15B, a rectangle, a trapezoid as shown in FIG. 15C or the like), or a polygonal shape (such as a hexagon as shown in FIG. 15D, a octagon or the like). In certain embodiments, on the X-Y plane of FIG. 15E, a shape of the top view of one metallization block MB include a first portion P1, a second portion P2 and a third portion P3 connecting the first portion P1 and the second portion P2. For example, on the X-Y plane, each of the first portion P1 and the second portion P2 includes a top view having a circular shape (such as a circle as shown in FIG. 15A, an oval, an ellipse or the like), a tetragonal shape (e.g., a square as shown in FIG. 15B, a rectangle, a trapezoid as shown in FIG. 15C or the like), or a polygonal shape (such as a hexagon as shown in FIG. 15D, a octagon or the like), and the third portion P3 includes a top view having a tetragonal shape, where along a direction perpendicular to an extending direction of the third portion P3, a size D3 of the third portion P3 is less than a size D1 of the first portion P1 and a size D2 of the second portion P2. The size D1 of the first portion P1 may be the same as the size D2 of the second portion P2. Alternatively, the size D1 of the first portion P1 may be different from the size D2 of the second portion P2.

However, the number of each of the first portion P1, the second portion P2 and the third portion P3 may not be limited to what is depicted in FIG. 15E, and may be selected or designated based on the demand and/or design layout. For example, on the X-Y plane of FIG. 15F, a shape of the top view of one metallization block MB includes two first portions P1, one second portion P2 and two third portion P3, where the first portions P1 and the second portion P2 are arranged in alternate manner along the extending direction of the third portions P3, and each of the first portions P1 is connected to the second portion P2 through one of the third portions P3. In the disclosure, the third portion P3 may be referred to as a wall portion of the metallization block MB while the first and second portions P1 and P2 each may be referred to as a pad portion of the metallization block MB. Although the top view of the seed layer 152 is not illustrated, the shape of the seed layer 152 and the shape of the metallization layer 154 (e.g. MB) in each conductive block CB of the redistribution circuit structure 150 share the same contour.

Continued to FIG. 9, in some embodiments, a semiconductor die 160A is disposed on the base substrate 110 and next to the redistribution circuit structure 150, in accordance with a step 1060 of FIG. 22. As shown in FIG. 9, only one semiconductor die 160A is presented for illustrative purposes, however, it should be noted that the number of the semiconductor die 160A may be one or more than one, the disclosure is not limited thereto.

In some embodiments, the semiconductor die 160A is picked and placed over the base substrate 110 and disposed on the surface S140 of the redistribution circuit structure 140, where the semiconductor die 160A is laterally distant from the redistribution circuit structure 150. In some embodiments, the semiconductor die 160A includes a semiconductor substrate 160s having an active surface 160a and a backside surface 160f opposite to the active surface 160a, a plurality of pads 160b distributed on the active surface 160a, a passivation layer 160c covering the active surface 160a and a portion of the pads 160b, a plurality of conductive vias 160d connecting to the pads 160b exposing by the passivation layer 160c, and a protection layer 160e disposed on the passivation layer 160c and wrapping around the conductive vias 160d. The pads 160b, the passivation layer 160c, the conductive vias 160d, and the protection layer 160e are formed on the semiconductor substrate 160s. The pads 160b are partially exposed by the passivation layer 160c, the conductive vias 160d are respectively disposed on and electrically connected to the pads 160b, and the protection layer 160e covers the passivation layer 160c exposed by the conductive vias 160d and exposes top surfaces (not labeled) of the conductive vias 160d.

However, the disclosure may not be limited thereto. For example, the conductive vias 160d and the protection layer 160e may be omitted. In an alternative embodiment, the semiconductor die 160A may include the semiconductor substrate 160s having the active surface 160a and the backside surface 160f opposite to the active surface 160a, the plurality of pads 160b distributed on the active surface 160a, and the passivation layer 160c covering the active surface 160a and a portion of the pads 160b.

The material of the semiconductor substrate 160s may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein or thereon. In some embodiments, such active components and passive components may be formed in a front-end-of-line (FEOL) process. In an alternative embodiment, the semiconductor substrate 160s may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In addition, the semiconductor substrate 160s may further include an interconnection structure (not shown) disposed on the active surface 160a. In certain embodiments, the interconnection structure may include one or more inter-dielectric layers and one or more patterned conductive layers stacked alternately for providing routing function to the active components and the passive components embedded in or formed on the semiconductor substrate 160s, where the pads 160b may be referred to as an outermost layer of the patterned conductive layers of the interconnection structure. In one embodiment, the interconnection structure may be formed in a back-end-of-line (BEOL) process. For example, the inter-dielectric layers may be silicon oxide layers, silicon nitride layers, silicon oxy-nitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition. However, the disclosure is not limited thereto.

The pads 160b are aluminum pads or other suitable metal pads, for example. The conductive vias 160d are copper pillars, copper alloy pillar or other suitable metal pillars containing copper metal, for example. In some embodiments, the passivation layer 160c and the protection layer 160e may be a PBO layer, a PI layer or other suitable polymers. In some alternative embodiments, the passivation layer 160c and the protection layer 160e may be made of inorganic materials, such as silicon oxide, silicon nitride, silicon oxynitride, or any suitable dielectric material. The material of the passivation layer 160c can be the same or different from the material of the protection layer 160e, for example. In some embodiments, a top surface (not labeled) of the protection layer 160e and the top surfaces of the conductive vias 160d exposed by the protection layer 160e are substantially levelled with and coplanar to each other, which are collectively referred to as a front side 160t of the semiconductor die 160A; and, the backside surface 160f of the semiconductor substrate 160s is referred to as a backside 160f of the semiconductor die 160A.

It is noted that, the semiconductor die 160A described herein is referred as a semiconductor chip or an integrated circuit (IC), for example. In an alternative embodiment, the semiconductor die 160A described herein may be a semiconductor device. In some embodiments, the semiconductor die 160A includes a digital chip, an analog chip or a mixed signal chip, such as an application-specific integrated circuit ("ASIC") chip, a sensor chip, a wireless and radio frequency (RF) chip, a memory chip, a logic chip or a voltage regulator chip. The logic chip may include a central processing unit (CPU), a graphics processing unit (GPU), a system-on-a-chip (SoC), a microcontroller, or the like. The memory chip may include a memory chip or device, such as a dynamic random-access memory (DRAM) die, a static random-access memory (SRAM) die, a hybrid memory cube (HMC) module, a high bandwidth memory (HBM) module, or the like. In alternative embodiments, the semiconductor die 160A may be referred to as a chip or an IC of combination-type, such as a WiFi chip simultaneously including both of a RF chip and a digital chip.

In certain embodiments, additional semiconductor die(s) of the same type or different types may be included. The additional semiconductor die(s) may include digital chips, analog chips or mixed signal chips, such as ASIC chips, sensor chips, wireless and RF chips, memory chips, logic chips or voltage regulator chips. The disclosure is not limited thereto. In the disclosure, it should be appreciated that the illustration of the semiconductor die 160A and other components throughout all figures is schematic and is not in scale.

Continued on FIG. 9, in some embodiments, the semiconductor die 160A is bonded to the base substrate 110 by adhering onto the redistribution circuit structure 140 with a connecting film 162. In other words, the backside 160t of the semiconductor die 160A is adhered to the surface S140 of the redistribution circuit structure 140 by the connecting film 162. That is, the connecting film 162 is sandwiched between the backside 160t of the semiconductor die 160A and the surface S140 of the redistribution circuit structure 140. Owing to the connecting film 162, the semiconductor die 160A is stably adhered to the redistribution circuit structure 140. In some embodiments, the connecting film 162 may be, but not limited to, a die attach film or a layer made of adhesives, epoxy-based resin, acrylic polymer, other suitable insulating material, or the like, and which may be with or without fillers filled therein (such as silica, alumina, or the like).

In some embodiments, in FIG. 9 and FIG. 13A, the semiconductor die 160A and the redistribution circuit structure 150 are arranged next to each other along the X-Y plane. In other word, the semiconductor die 160A are not overlapped with the redistribution circuit structure 150 in the direction Z, but are overlapped with each other in the direction X and/or the direction Y. In one embodiment of FIG. 13A, the redistribution circuit structure 150 includes multiple conductive blocks CB, where the metallization blocks MB have different shapes, at least in part. However, the disclosure is not limited thereto; alternatively, the redistribution circuit structure 150 may include multiple conductive blocks CB, where the metallization blocks MB all have identical shapes, see FIG. 13B.

Figure 10:
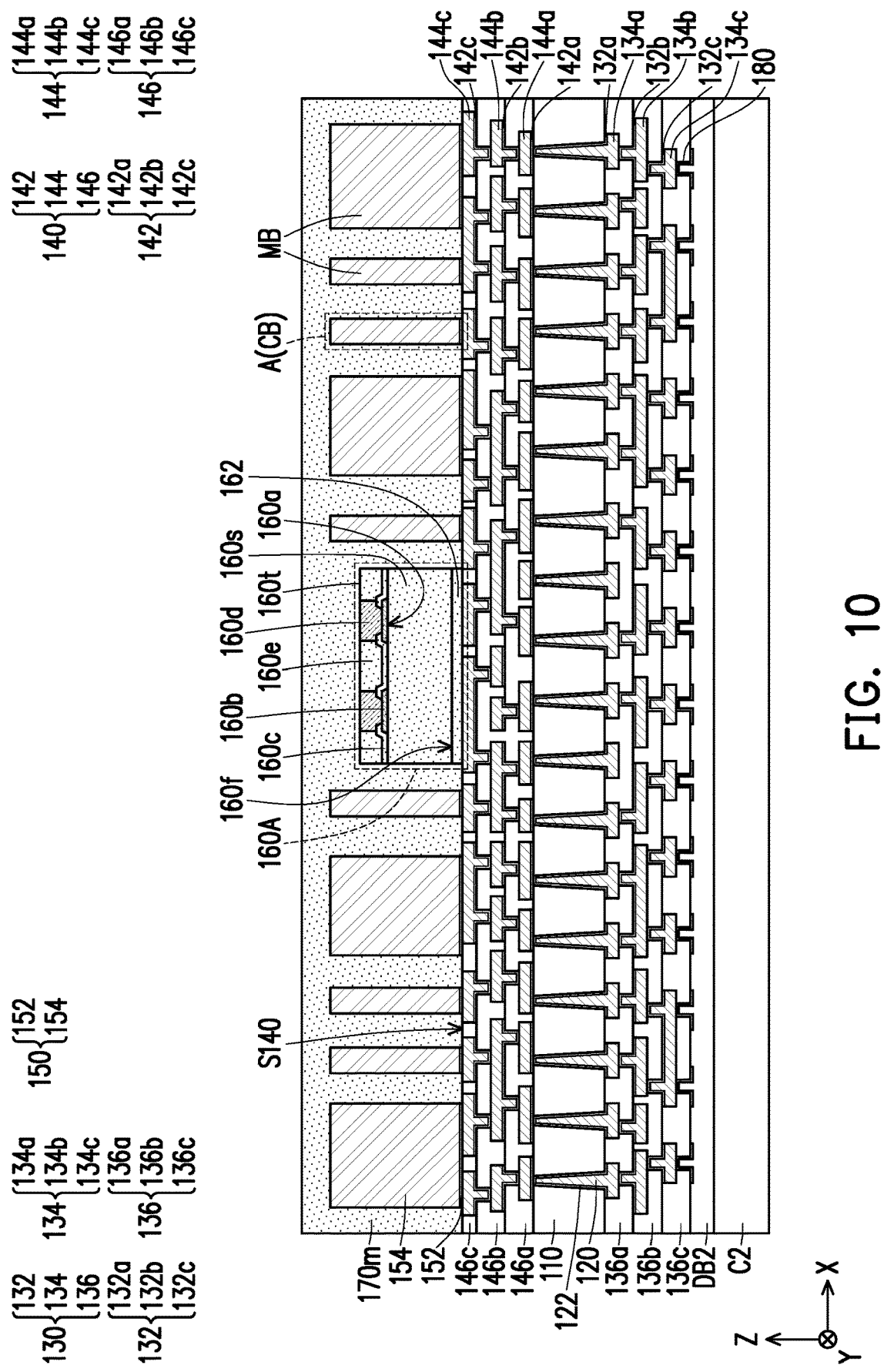

Referring to FIG. 10, in some embodiments, the redistribution circuit structure 150 and the semiconductor dies 160 are encapsulated in an insulating encapsulation 170m, in accordance with a step 1017 of FIG. 22. In some embodiments, the insulating encapsulation 170m is formed on the redistribution circuit structure 140 over the base substrate 110. As shown in FIG. 10, the insulating encapsulation 170m at least fills up the gaps between the redistribution circuit structure 150 and the semiconductor die 160A and the gaps between the conductive blocks CB of the redistribution circuit structure 150, for example. In some embodiments, the insulating encapsulation 170m covers the redistribution circuit structure 150 and the semiconductor die 160A. In other words, for example, the redistribution circuit structure 150 and the semiconductor die 160A are not accessibly revealed by and embedded in the insulating encapsulation 170m.

In some embodiments, the insulating encapsulation 170m is a molding compound formed by a molding process. In some embodiments, the insulating encapsulation 170m, for example, may include polymers (such as epoxy resins, phenolic resins, silicon-containing resins, or other suitable resins), dielectric materials, or other suitable materials. In an alternative embodiment, the insulating encapsulation 170m may include an acceptable insulating encapsulation material. In some embodiments, the insulating encapsulation 170m may further include inorganic filler or inorganic compound (e.g. silica, clay, and so on) which can be added therein to optimize coefficient of thermal expansion (CTE) of the insulating encapsulation 170m. The disclosure is not limited thereto.

Figure 11:
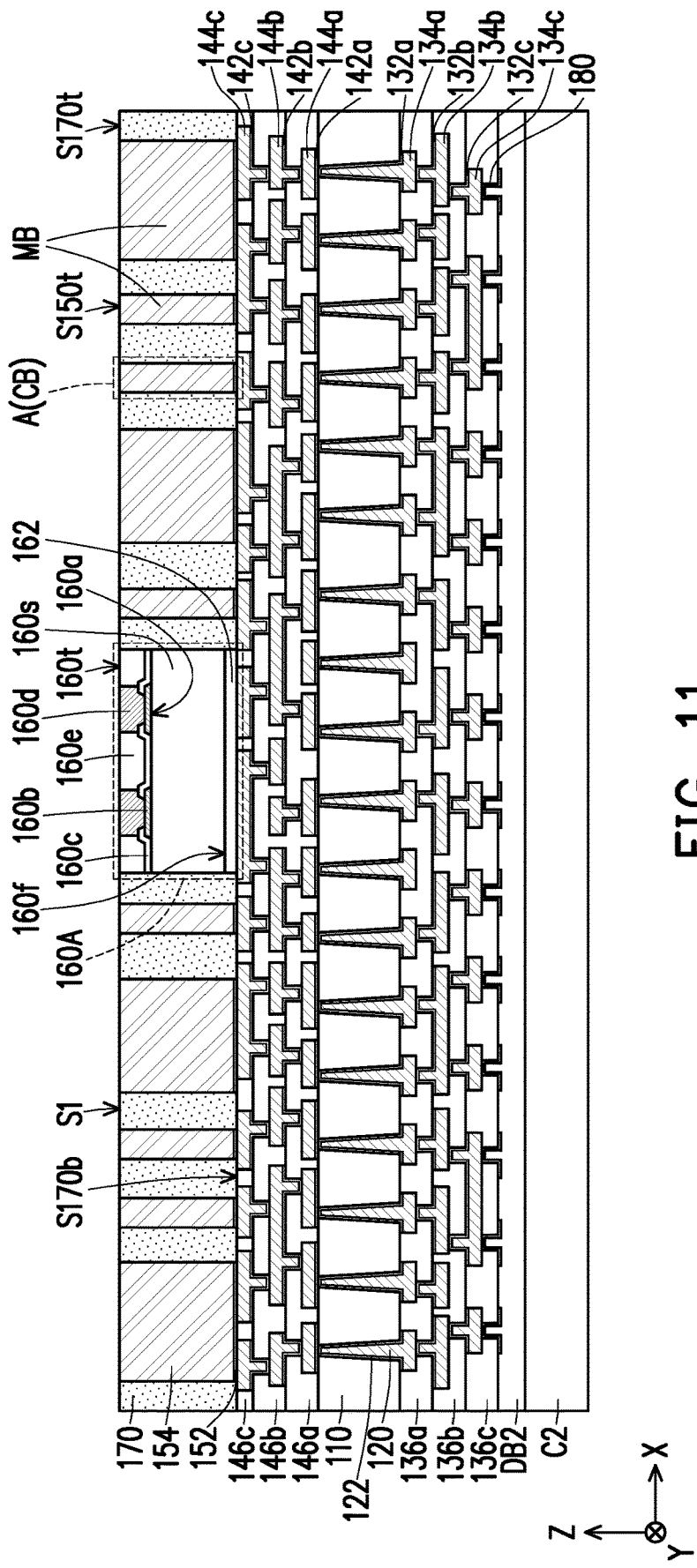

Referring to FIG. 10 and FIG. 11, in some embodiments, the insulating encapsulation 170m is planarized to form an insulating encapsulation 170 exposing the redistribution circuit structure 150 and the semiconductor die 160A. In certain embodiments, as shown in FIG. 11, after the planarization, the front surface 160t of the semiconductor die 160A (including the top surfaces of the conductive vias 160d and the top surface of the protection layer 160e of the semiconductor die 160A) and a top surface of the redistribution circuit structure 150 (including top surfaces S150t of the conductive blocks CB including the metallization blocks MB) are exposed by a top surface S170t of the insulating encapsulation 170. That is, for example, the top surface (e.g. S150t) of the redistribution circuit structure 150 and the front surface 160t of the semiconductor die 160A become substantially leveled with the top surface S170t of the insulating encapsulation 170. In other words, the top surface (e.g. S150t) of the redistribution circuit structure 150, the front surface 160t of the semiconductor die 160A and the top surface S170t of the insulating encapsulation 170 are substantially coplanar to each other. In some embodiments, as shown in FIG. 11, the semiconductor die 160A and the redistribution circuit structure 150 are accessibly revealed by the insulating encapsulation 170. That is, for example, the metallization blocks MB of the conductive blocks CB of the redistribution circuit structure 150 and the conductive vias 160d of the semiconductor die 160A are accessibly revealed by the insulating encapsulation 170. In some embodiments, for example, sidewalls (not labeled) of the semiconductor die 160A and the sidewalls (e.g. SW152 and SW154) of the conductive blocks CB of the redistribution circuit structure 150 are also covered by the insulating encapsulation 170.

The insulating encapsulation 170m may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 170m, the conductive vias 160d and the protection layer 160e of the semiconductor die 160A and/or the metallization blocks MB of the conductive blocks CB of the redistribution circuit structure 150 may also be planarized. In certain embodiments, the planarizing step may be, for example, performed on the over-molded insulating encapsulation 170m to level the top surface (e.g. S150t) of the redistribution circuit structure 150, the front surface 160t of the semiconductor die 160A and the top surface S170t of the insulating encapsulation 170.

In some embodiments, at least some of the conductive blocks CB included in the redistribution circuit structure 150, which are molded inside the insulating encapsulation 170 and laterally next to the semiconductor die 160A, individually, are electrically connected to two or more than two conductive vias 120 through the redistribution circuit structure 140. Owing to the conductive blocks CB, a horizontal, electrical connection between the conductive vias 120 is provided. In addition, owing to the conductive blocks CB, a vertical, electrical connection between the conductive vias 120 and external components is also provided. As shown in FIG. 11, for example, a thickness of the conductive blocks CB of the redistribution circuit structure 150 is substantially equal to a sum of a thickness of the semiconductor die 160A and a thickness of the connecting film 162.

Figure 12:
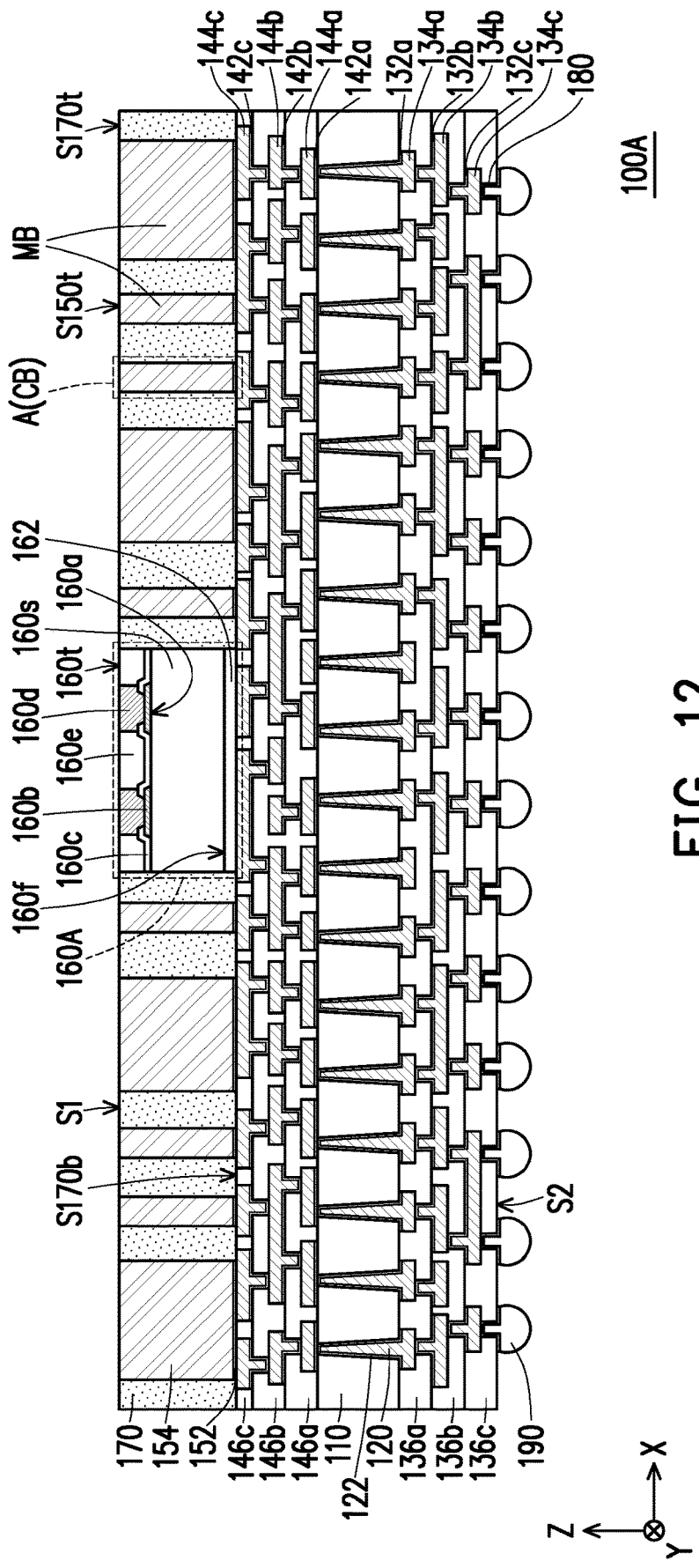
Figure 13A:
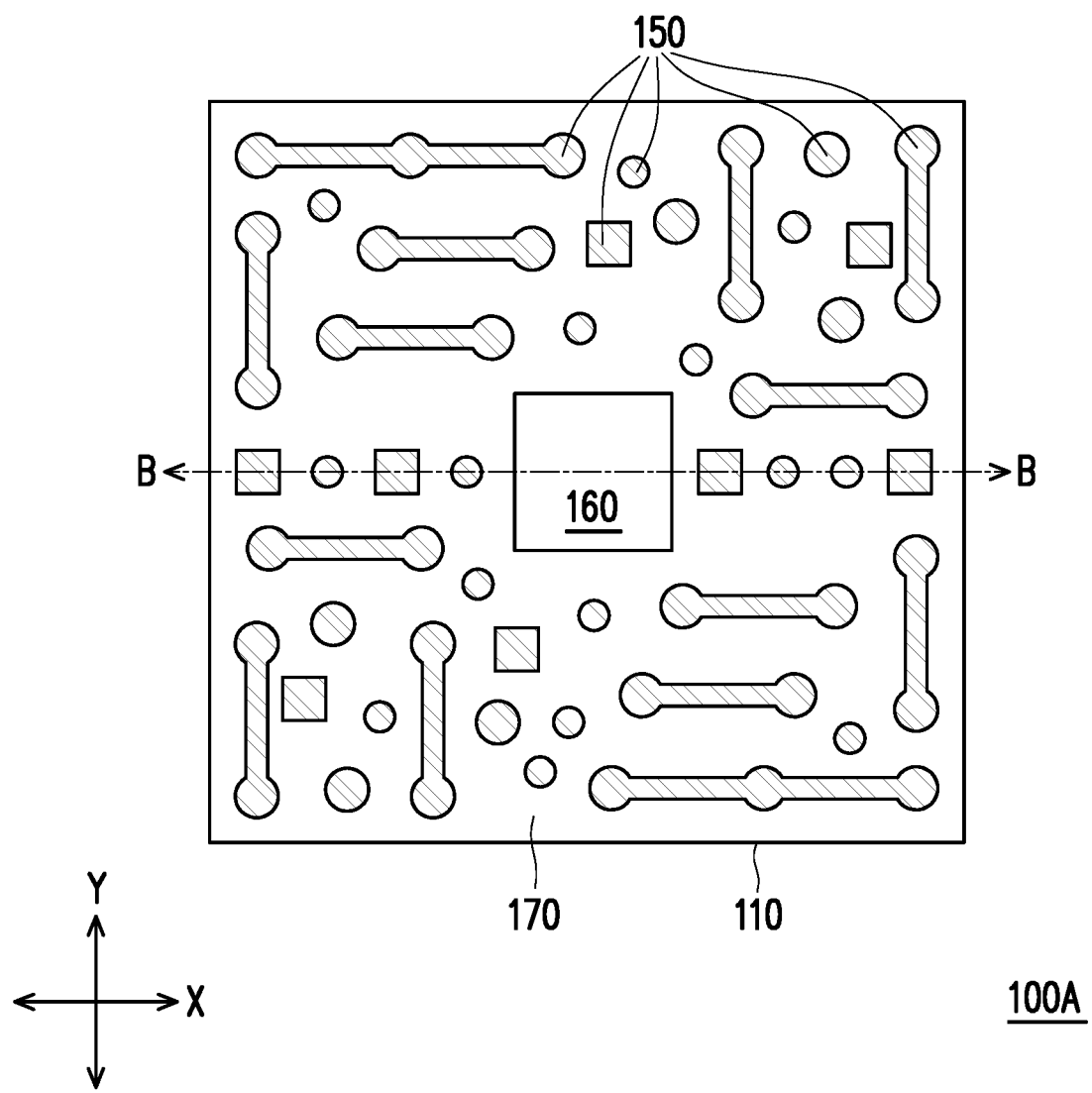
FIG. 13A is a schematic plane view illustrating a relative position of a semiconductor die and a redistribution circuit structure including a plurality of conductive blocks included in the circuit substrate depicted in FIG. 12.
Figure 13B:
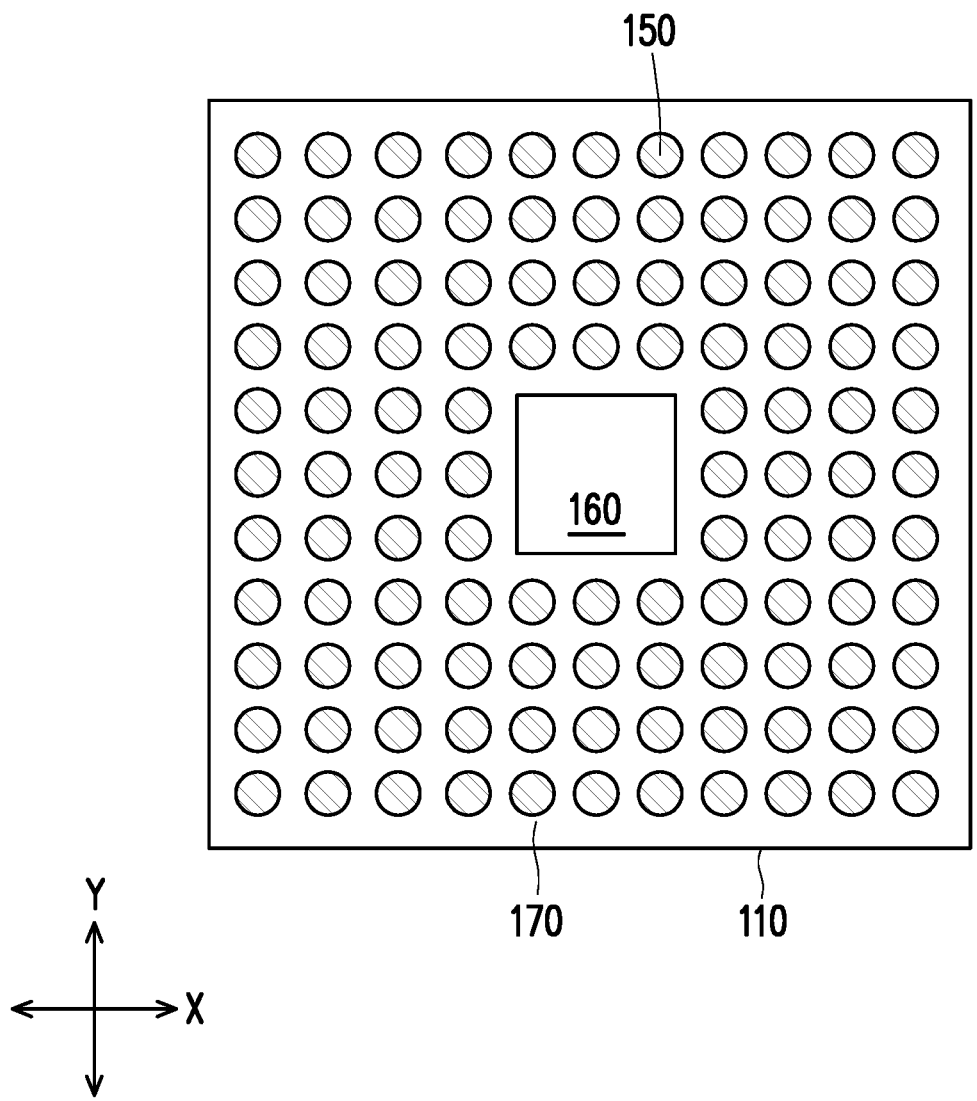
FIG. 13B is a schematic plane view illustrating a relative position of a semiconductor die and a redistribution circuit structure including a plurality of conductive blocks included in a circuit substrate in accordance with some alternative embodiments of the disclosure.

Referring to FIG. 12, in some embodiments, a plurality of conductive terminals 190 are formed on the UBM patterns 180 over the base substrate 110 to form a circuit substrate 100A. For example, the circuit substrate 100A has a first side S1 with the redistribution circuit structure 150 and the semiconductor die 160A being accessibly revealed therefrom and a second side S2 with the conductive terminals 190 being accessibly revealed therefrom. The first side S1 is opposite to the second side along the direction Z, which is referred to the stacking direction of the base substrate 110 and the semiconductor die 160A.

In some embodiments, as shown in FIG. 12, the conductive terminals 190 are respectively formed on the UBM patterns 180, such that the conductive terminals 190 are electrically connected to the redistribution circuit structure 130 through the UBM patterns 180. Due to the UBM patterns 180, the adhesive strength between the conductive terminals 190 and the redistribution circuit structure 130 is enhanced. For example, through the UBM patterns 180 and the redistribution circuit structure 130, the conductive terminals 190 are electrically connected to the conductive vias 120, so to electrically connect to the redistribution circuit structure 150 through the redistribution circuit structure 140 and the conductive vias 120. In some embodiments, the redistribution circuit structure 130 is located between the base substrate 110 and the conductive terminals 190. The conductive terminals 190 may be disposed on the UBM patterns 180 by ball placement process or reflow process. The conductive terminals 190 may be micro-bumps, metal pillars, electroless nickel-electroless palladium-immersion gold (ENEPIG) formed bumps, controlled collapse chip connection (C4) bumps, a ball grid array (BGA) bumps or balls, solder balls, or the like. The disclosure is not limited thereto. The numbers of the conductive terminals 190 may correspond to the numbers of the UBM patterns 180. When solder is used, the solder may include either eutectic solder or non-eutectic solder. The solder may include lead or be lead-free, and may include Sn—Ag, Sn—Cu, Sn—Ag—Cu, or the like. The conductive terminals 190 and the conductive blocks CB of the redistribution circuit structure 150, individually, may be referred to as conductive terminals of the circuit substrate 100A, e.g. at opposite sides of the circuit substrate 100A. Alternatively, the conductive terminals 190 may be omitted.

In some embodiments, prior to forming the conductive terminals 190 over the UBM patterns 180, a debonding process is performed to remove the carrier C2 and the debond layer DB2 from the redistribution circuit structure 130, so to release the UBM patterns 180 from the debond layer DB2. In one embodiment, the debonding process is a laser debonding process. Up to here, the circuit substrate 100A is manufactured.

In the embodiments of the circuit substrate 100A as shown in FIG. 12, the semiconductor die 160A embedded therein is configured to be electrically connected to a later formed components for external signal connections, directly by itself. That is, if only considering the internal circuitry of the circuit substrate 100A, the semiconductor die 160A embedded in the circuit substrate 100A is not electrically connected to rest of the components included in the circuit substrate 100A, such as the conductive vias 120, the redistribution circuit structures 130, 140 and/or 150, the UBM patterns 160, and/or the conductive terminals 190.

Figure 16:
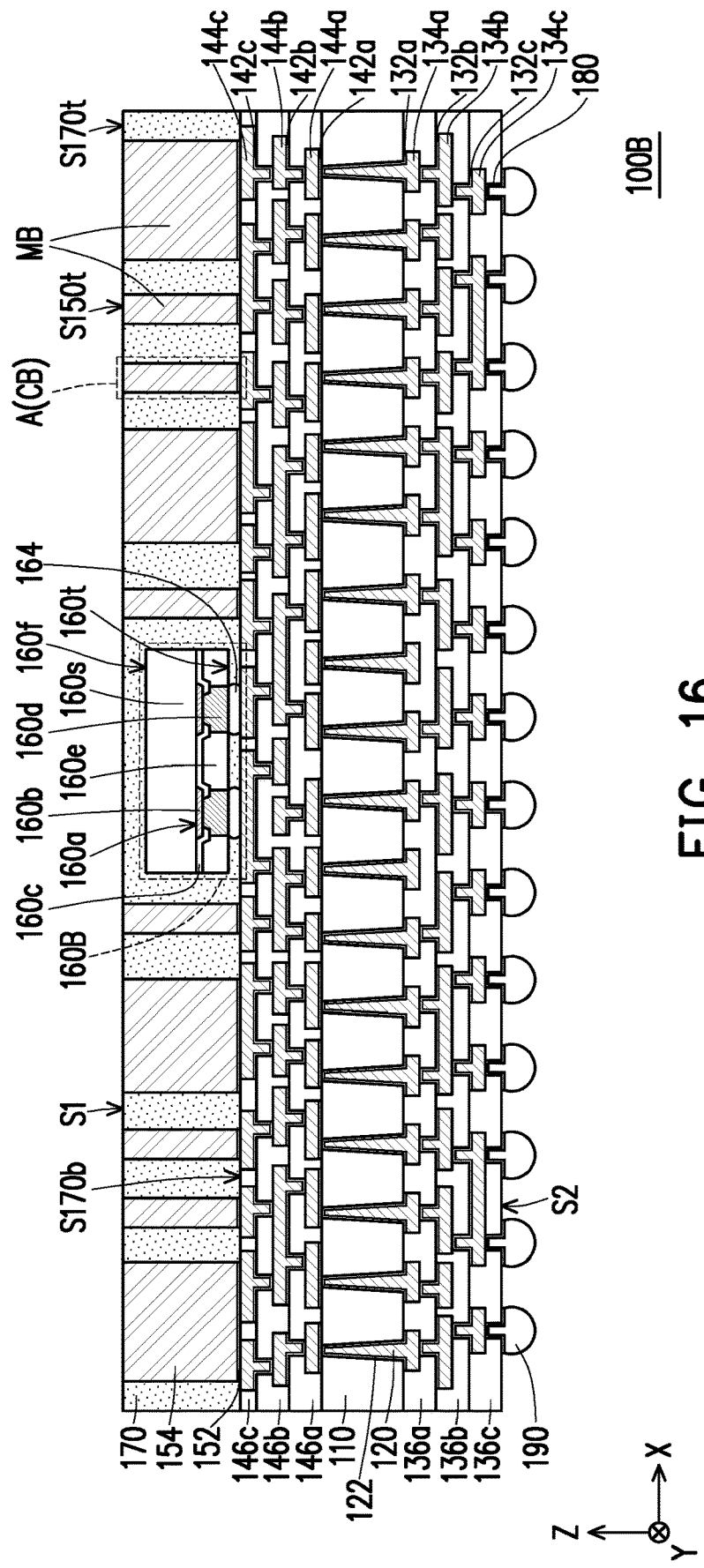
FIG. 16 is a schematic cross-sectional view showing a circuit substrate in accordance with some alternative embodiments of the disclosure.

However, the disclosure is not limited thereto; alternatively, a semiconductor die embedded in a circuit substrate may be electrically connected to rest of the components included in the circuit substrate so to be electrically connected to a later formed components for external signal connections by rest of the components included in the circuit substrate, see a circuit substrate 100B of FIG. 16 and a circuit substrate 100C of FIG. 17. For example, the circuit substrate 100B of FIG. 16 and the circuit substrate 100A of FIG. 12 are similar; the difference is that, a semiconductor die 160B is adopted to be integrated in the circuit substrate 100B by a plurality of conductive joints 164, instead. The semiconductor die 160B is similar to the semiconductor die 160A, except a thickness of the semiconductor die 160B is less than the thickness of the semiconductor die 160A along the direction Z, and thus the detail of the semiconductor die 160B is omitted. In some embodiments, as shown in FIG. 16, the conductive joints 164 are located between and electrically connecting the semiconductor die 160B (e.g. the conductive vias 160d) and the redistribution circuit structure 140 (e.g. the exposed portions of the metallization layer 144c). In some embodiments, the semiconductor die 160B is bonded to the exposed portions of the metallization layer 144c of the redistribution circuit structure 140 through the conductive joints 164, by flip chip bonding process. In some embodiments, the semiconductor die 160B is electrically connected to at least some of the conductive terminals 190 through the redistribution circuit structure 140, at least some of the conductive vias 120, and the redistribution circuit structure 130. In some embodiments, the semiconductor die 160B is electrically connected to at least some of the conductive blocks CB of the redistribution circuit structure 150 through the redistribution circuit structure 140. As illustrated in FIG. 16, for example, the semiconductor die 160B is completely embedded inside the insulating encapsulation 170, where the backside 160f of the semiconductor die 160B is not accessibly revealed by the insulating encapsulation 170. That is, the thickness of the conductive blocks CB of the redistribution circuit structure 150 is greater than a sum of the thickness of the semiconductor die 160B and a thickness of the conductive joints 164 located between and electrically connecting the semiconductor die 160B and the redistribution circuit structure 140, in some embodiments. With such, the semiconductor die 160B embedded in the circuit substrate 100B is configured to be electrically connected to a later formed components for external signal connections only through the rest of the components included in the circuit substrate 100C. Alternatively, the semiconductor die 160B may be embedded inside the insulating encapsulation 170, where the backside 160f of the semiconductor die 160B may be substantially coplanar to and accessibly revealed by the top surface S170t of the insulating encapsulation 170.

Figure 17:
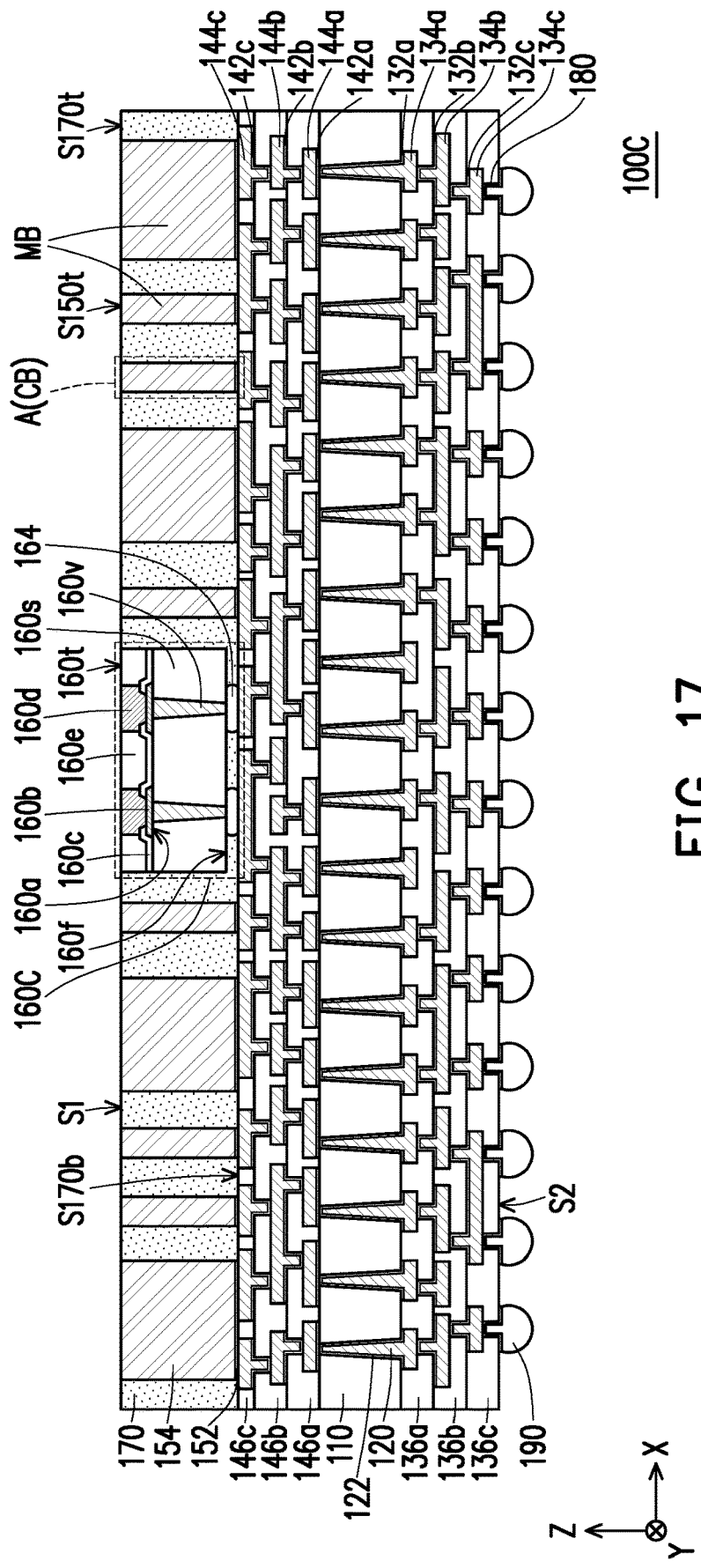
FIG. 17 is a schematic cross-sectional view showing a circuit substrate in accordance with some alternative embodiments of the disclosure.

In some alternative embodiments, the circuit substrate 100C of FIG. 17 and the circuit substrate 100A of FIG. 12 are similar; the difference is that, a semiconductor die 160C is adopted to be integrated in the circuit substrate 100C by a plurality of conductive joints 164, instead. In some embodiments, as shown in FIG. 17, the semiconductor die 160C of FIG. 17 is similar to the semiconductor die 160A of FIG. 12, the difference is that, the semiconductor die 160C further includes through silicon vias (TSVs) 160v penetrating the semiconductor substrate 160s and connecting the pads 160b, where the TSVs 160v are electrically connected to the conductive vias 160d through the pads 160b and/or are electrically connected to the active and/or passive components formed in/on the semiconductor substrate 160s through the pads 160b. In some embodiments, as shown in FIG. 17, the conductive joints 164 are located between and electrically connecting the semiconductor die 160C (e.g. the TSVs 160v) and the redistribution circuit structure 140 (e.g. the exposed portions of the metallization layer 144c). In some embodiments, the semiconductor die 160C is bonded to the exposed portions of the metallization layer 144c of the redistribution circuit structure 140 through the conductive joints 164, by flip chip bonding process. In some embodiments, the semiconductor die 160C is electrically connected to at least some of the conductive terminals 190 through the redistribution circuit structure 140, at least some of the conductive vias 120, and the redistribution circuit structure 130. In some embodiments, the semiconductor die 160C is electrically connected to at least some of the conductive blocks CB of the redistribution circuit structure 150 through the redistribution circuit structure 140. As illustrated in FIG. 17, for example, the front side 160t of the semiconductor die 160C is embedded inside the insulating encapsulation 170, where the front side 160t of the semiconductor die 160C is substantially coplanar to and accessibly revealed by the top surface S170t of the insulating encapsulation 170. That is, the thickness of the conductive blocks CB of the redistribution circuit structure 150 is substantially equal to a sum of a thickness of the semiconductor die 160C and the thickness of the conductive joints 164 located between and electrically connecting the semiconductor die 160C and the redistribution circuit structure 140, in some embodiments. With such, the semiconductor die 160C embedded in the circuit substrate 100C is configured to be electrically connected to a later formed components for external signal connections not only directly by itself but also through the rest of the components included in the circuit substrate 100C.

For example, the TSVs 160v are embedded in the semiconductor substrate 160s and extended from the active surface 160a towards the backside surface 160f along the direction Z. In some embodiments, the TSVs 160v may be tapered from the interconnection structure to the backside surface 160f. Alternatively, the TSVs 160v may have substantially vertical sidewalls. In a cross-sectional view along the direction Z, the shape of the TSVs 160v may depend on the design requirements, and is not intended to be limiting in the disclosure. For example, in a top (plane) view on the X-Y plane perpendicular to the direction Z, the shape of the TSVs 160v is circular shape. However, depending on the design requirements, and the shape of the TSVs 160v may be an oval shape, a rectangular shape, a polygonal shape, or combinations thereof; the disclosure is not limited thereto.

The TSVs 160v may be formed of a conductive material, such as copper, tungsten, aluminum, silver, combinations thereof, or the like. In some embodiments, each of the TSVs 160v is separated from the semiconductor substrate 160s by a liner (not shown). The liners may be formed of a barrier material, such as TiN, Ta, TaN, Ti, or the like. In alternative embodiments, a dielectric liner (not shown) (e.g., silicon nitride, an oxide, a polymer, a combination thereof, etc.) may be further optionally formed between the liners and the semiconductor substrate 160s. In some embodiments, the TSVs 160v, the liners and the optional dielectric liner are formed by forming recesses in the semiconductor substrate 160s and respectively depositing the dielectric material, the barrier material, and the conductive material in the recesses, removing excess materials on the semiconductor substrate 160s. For example, the recesses of the semiconductor substrate 160s are lined with the dielectric liner so as to laterally separate the liners lining sidewalls of the TSVs 160v from the semiconductor substrate 160s. The TSVs 160v are formed by using a via-first approach, in certain embodiments. In such embodiments, the TSVs 160v are formed prior to the formation of the interconnection structure. As shown in FIG. 1, in some embodiments, the TSV 160v are separated from the semiconductor substrate 160s through at least the liners 270. Alternatively, the liners may be omitted. Alternatively, the TSVs 160v may be formed by using a via-last approach, and may be formed after the formation of interconnection structure. The disclosure is not limited thereto. The number of the TSV 160v are not limited to the disclosure, and may be selected and designated based on the demand and design layout.

In the embodiments of the circuit substrate 100A as shown in FIG. 12, only one semiconductor die 160A is shown to be embedded in the circuit structure 100A. However, the disclosure is not limited thereto; alternatively, a die stack including a plurality of semiconductor die may be embedded in a circuit substrate.

Figure 18:
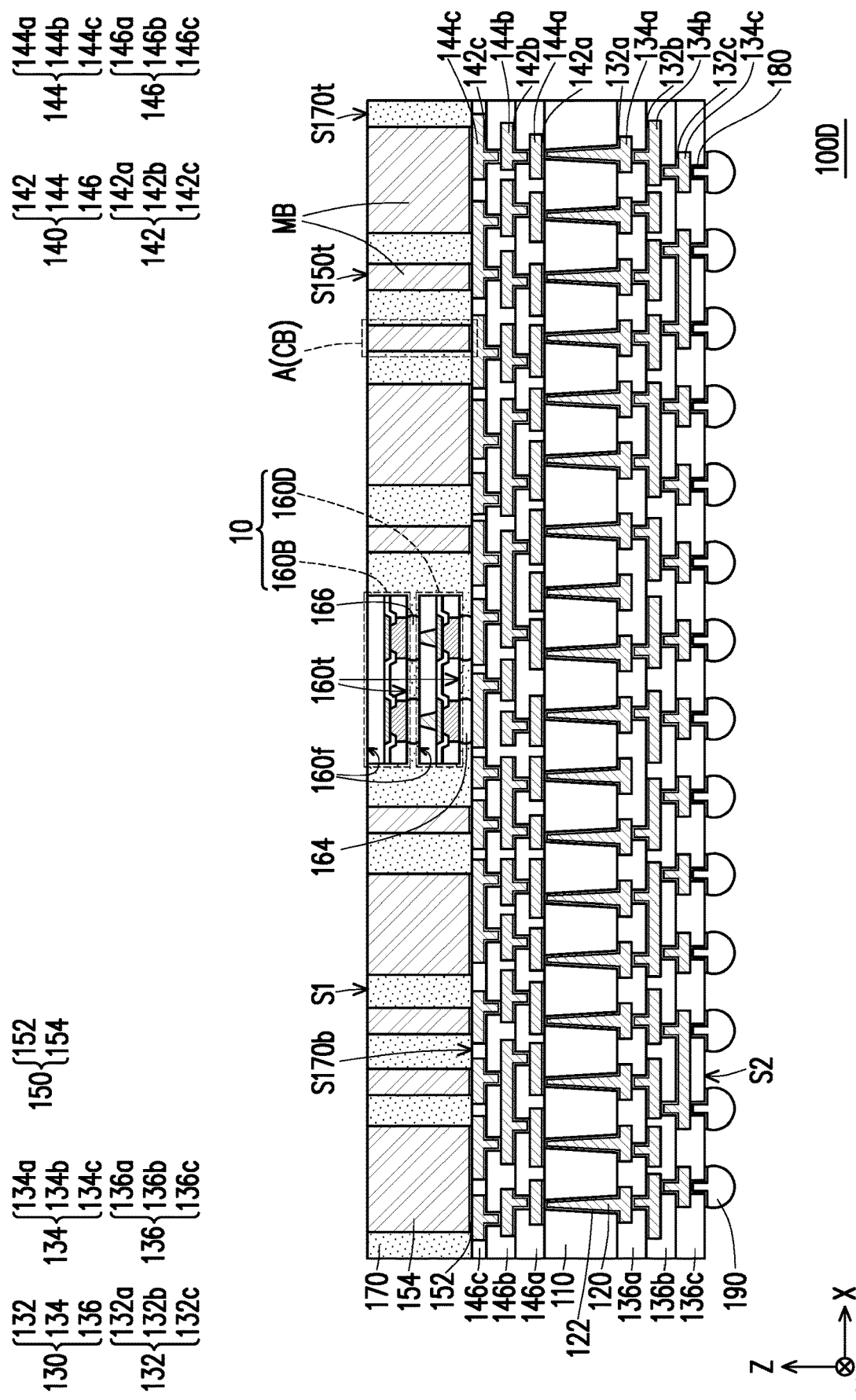
FIG. 18 is a schematic cross-sectional view showing a circuit substrate in accordance with some alternative embodiments of the disclosure.

In some alternative embodiments, the circuit substrate 100D of FIG. 18 and the circuit substrate 100A of FIG. 12 are similar; the difference is that, a die stack 10 including a semiconductor die 160B and a semiconductor die 160D stacked on the semiconductor die 160B is adopted to be integrated in the circuit substrate 100D by a plurality of conductive joints 164, instead. In some embodiments, as shown in FIG. 18, the semiconductor die 160B is bonded to the semiconductor die 160D to form the die stack 10 by flip chip bonding process, where the conductive vias 160d of the semiconductor die 160B are electrically connected to the TSVs 160v of the semiconductor die 160D through a plurality of conductive joints 166. In one embodiment, the die stack 10 is pre-fabricated before mounting to the redistribution circuit structure 140 through the conductive joints 164. However, the disclosure is not limited thereto; alternatively, the semiconductor die 160D may be initially mounted to the redistribution circuit structure 140 through the conductive joints 164, and the semiconductor die 160B may be mounted to the semiconductor die 160D through the conductive joints 166 to form the die stack 10 on the redistribution circuit structure 140. The semiconductor die 160D is similar to the semiconductor die 160C, except a thickness of the semiconductor die 160D is less than the thickness of the semiconductor die 160C along the direction Z, and thus the detail of the semiconductor die 160D is omitted.

In some embodiments, as shown in FIG. 18, the conductive joints 164 are located between and electrically connecting the die stack 10 (e.g. the conductive vias 160d of the semiconductor die 160D) and the redistribution circuit structure 140 (e.g. the exposed portions of the metallization layer 144c). In some embodiments, the die stack 10 is bonded to the exposed portions of the metallization layer 144c of the redistribution circuit structure 140 through the conductive joints 164, by flip chip bonding process. In some embodiments, the die stack 10 is electrically connected to at least some of the conductive terminals 190 through the redistribution circuit structure 140, at least some of the conductive vias 120, and the redistribution circuit structure 130. In some embodiments, the die stack 10 is electrically connected to at least some of the conductive blocks CB of the redistribution circuit structure 150 through the redistribution circuit structure 140. As illustrated in FIG. 18, for example, the die stack 10 is embedded inside the insulating encapsulation 170, where a surface (e.g. the backside 160f of the semiconductor die 160B) of the die stack 10 is substantially coplanar to and accessibly revealed by the top surface S170t of the insulating encapsulation 170. That is, the thickness of the conductive blocks CB of the redistribution circuit structure 150 is substantially equal to a sum of a thickness of the die stack 10 and the thickness of the conductive joints 164 located between and electrically connecting the die stack 10 and the redistribution circuit structure 140, in some embodiments. With such, the die stack 10 embedded in the circuit substrate 100D is configured to be electrically connected to a later formed components for external signal connections only through the rest of the components included in the circuit substrate 100D.

However, the disclosure is not limited thereto; alternatively, the die stack 10 may completely embedded inside the insulating encapsulation 170, where the surface (e.g. the backside 160f of the semiconductor die 160B) of the die stack 10 is cover by and not accessibly revealed by the insulating encapsulation 170. That is, the thickness of the conductive blocks CB of the redistribution circuit structure 150 is greater than a sum of a thickness of the die stack 10 and the thickness of the conductive joints 164 located between and electrically connecting the die stack 10 and the redistribution circuit structure 140, in some embodiments.

In other embodiments, the die stack 10 may be bonded to the redistribution circuit structure 140 through a connecting film (e.g., 162 depicted in FIG. 12) to have the front side 160t of the semiconductor die 160D being substantially coplanar to and accessibly revealed by the top surface S170t of the insulating encapsulation 170, where the backside 160f of the semiconductor die 160C is adhered to the surface S140 of the redistribution circuit structure 140 through the connecting film. Such that, the die stack 10 embedded in the circuit substrate 100D is configured to be electrically connected to a later formed components for external signal connections, directly by itself. That is, with such embodiments, if only considering the internal circuitry of the circuit substrate 100D, the die stack 10 embedded in the circuit substrate 100D is not electrically connected to rest of the components included in the circuit substrate 100D, such as the conductive vias 120, the redistribution circuit structures 130, 140 and/or 150, the UBM patterns 160, and/or the conductive terminals 190.

Yet, in further embodiments, the semiconductor die 160B of the die stack 10 may be substituted by another semiconductor die 160D to have surfaces of the TSVs 160v of the another semiconductor die 160D being substantially coplanar to and accessibly revealed by the top surface S170t of the insulating encapsulation 170; such that, the die stack embedded in the circuit substrate 100D is configured to be electrically connected to a later formed components for external signal connections not only directly by itself but also through the rest of the components included in the circuit substrate 100D.

In the embodiments of the circuit substrate 100A as shown in FIG. 12, only one semiconductor device (e.g. semiconductor die 160A) is adopted to be embedded in the circuit structure 100A. However, the disclosure is not limited thereto; alternatively, multiple semiconductor devices (e.g. 160A, 160B, 160C, 160D, 160E (in FIG. 21), and/or 10) may be embedded in and integrated to a circuit substrate. For example, the multiple semiconductor devices are arranged side-by-side on the X-Y plane over the base substrate 110. That is, the multiple semiconductor devices may be laterally located next to one another. In one embodiment, the multiple semiconductor devices are arranged into an array of matrix. In one embodiment, the multiple semiconductor devices are arranged, randomly.

Figure 19:
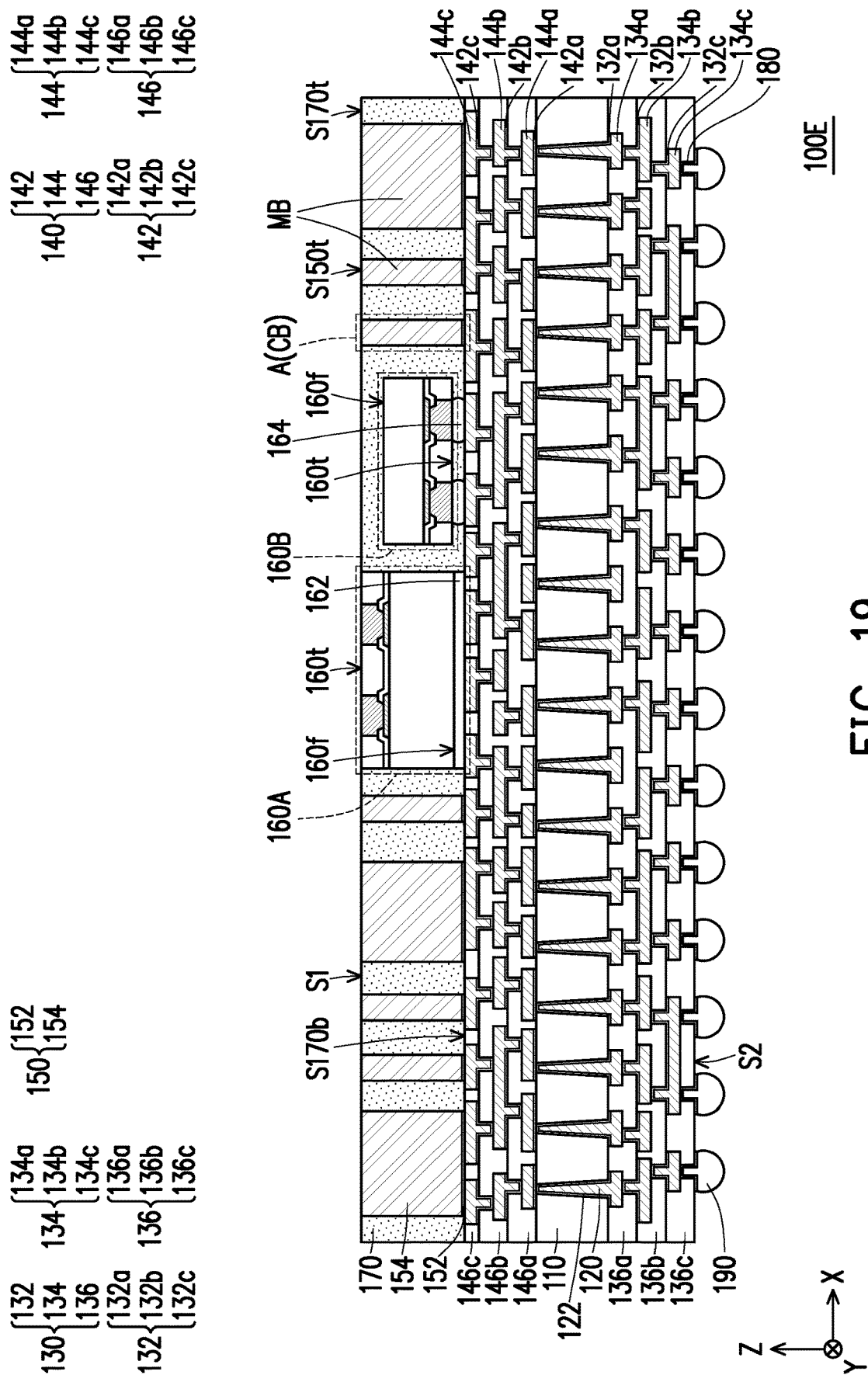
FIG. 19 is a schematic cross-sectional view showing a circuit substrate in accordance with some alternative embodiments of the disclosure.

In some embodiments, two or more than two types of the semiconductor die 160A, the semiconductor die 160B, the semiconductor die 160C, the semiconductor die 160D, the die stack 10 and modifications thereof as described in FIG. 12 and FIG. 16 through FIG. 18 may be integrated in one circuit substrate, where the number of each type being integrated thereto is one or more than one. In some other embodiments, two or more than two of one of the semiconductor die 160A, the semiconductor die 160B, the semiconductor die 160C, the semiconductor die 160D, the die stack 10 and modifications thereof as described in FIG. 12 and FIG. 16 through FIG. 18 may be integrated in one circuit substrate. For example, as shown in FIG. 19, a semiconductor die 160A and a semiconductor die 160B are adopted to be integrated in a circuit substrate 100E. In another example, a semiconductor die 160A and a die stack 10 are adopted to be integrated in one circuit substrate. In another example, a semiconductor die 160A, a semiconductor die 160C and a die stack 10 are adopted to be integrated in one circuit substrate.

In the embodiments of the circuit substrate 100A as shown in FIG. 12, the redistribution circuit structure 140 is located between and electrically connected the redistribution circuit structure 150 having the conductive blocks CB and the base substrate 110 having the conductive vias 120. However, the disclosure is not limited thereto; alternatively, the redistribution circuit structure 140 located between the redistribution circuit structure 150 having the conductive blocks CB and the base substrate 110 having the conductive vias 120 may be omitted.

Figure 20:
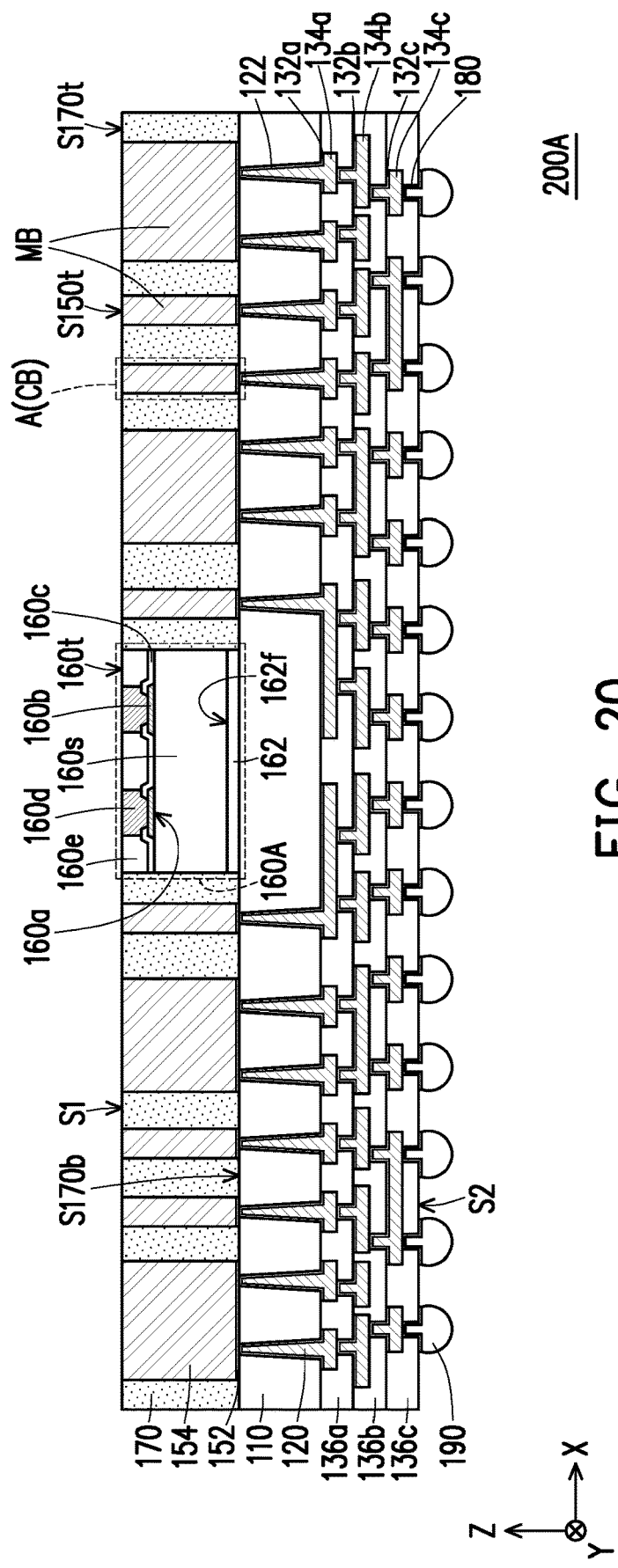
FIG. 20 is a schematic cross-sectional view showing a circuit substrate in accordance with some alternative embodiments of the disclosure.

For example, a circuit substrate 200A of FIG. 20 and the circuit substrate 100A of FIG. 12 are similar; the difference is that, the circuit substrate 200A excludes the redistribution circuit structure 140. In some embodiments, as shown in FIG. 20, the semiconductor die 160A is directly adhered to the second main surface S110b of the base substrate 110 through the connecting film 162, and the redistribution circuit structure 150 is directly formed on the second main surface S110b of the base substrate 110. That is, the conductive blocks CB of the redistribution circuit structure 150 are physically and electrically connected to the conductive vias 120 formed in the base substrate 110, for example. In some embodiments, at least some of the conductive blocks CB included in the redistribution circuit structure 150, which are molded inside the insulating encapsulation 170 and laterally next to the semiconductor die 160A, individually, are electrically connected to two or more than two conductive vias 120, directly. With such configuration, an overall thickness of the circuit substrate 200A is reduced. Owing to the conductive blocks CB, a horizontal, electrical connection between the conductive vias 120 is provided. In addition, owing to the conductive blocks CB, a vertical, electrical connection between the conductive vias 120 and external components is also provided. As shown in FIG. 20, for example, the thickness of the conductive blocks CB of the redistribution circuit structure 150 is substantially equal to a sum of the thickness of the semiconductor die 160A and the thickness of the connecting film 162.

The circuit structure 200A may be formed by the forming process of the circuit structure 100A in conjunction with the method of FIG. 22, except the step 1040 of FIG. 22 as described in FIG. 8; and thus, are not repeated herein for simplicity. Although no conductive via 120 is shown to be positioned directly under the semiconductor die 160A, there may be one or more than one conductive via 120 directly under the semiconductor die 160A in the circuit structure 200A. It is appreciated that the modifications to the circuit structure 100A may also be adopted by the circuit structure 200A, through with or without the conductive vias 120 directly under the semiconductor die 160A in the circuit structure 200A. Since the details of the modifications to the circuit structure 100A have been described in FIG. 12 and FIG. 16 through FIG. 19, the detailed descriptions are omitted herein for brevity.

In the embodiments of the circuit substrate 200A as shown in FIG. 20, the base substrate 110 have two opposite outmost surfaces being planar and flat, such as the first main surface S110t and the second main surface S110b. However, the disclosure is not limited thereto; alternatively, the base substrate 110 may have two outmost surfaces both being non-planar (with one or more recesses) or two outmost surfaces with only one thereof being non-planar (with one or more recesses). With the presence of the recesses formed in the base substrate 110, a semiconductor die having large thickness (in the direction Z) may be integrated in the circuit substrate without increasing the overall thickness of the circuit substrate.

Figure 21:
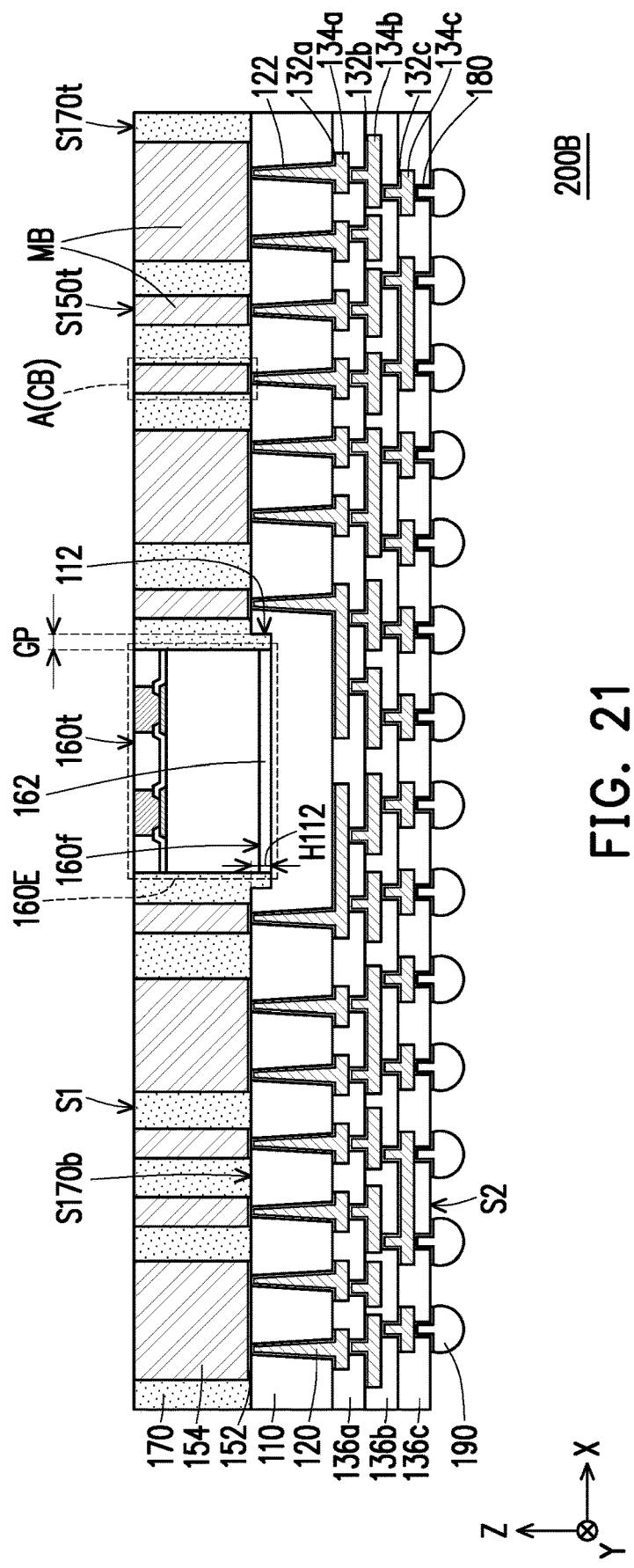
FIG. 21 is a schematic cross-sectional view showing a circuit substrate in accordance with some alternative embodiments of the disclosure.

For example, a circuit substrate 200B of FIG. 21 and the circuit substrate 200A of FIG. 20 are similar; the difference is that, a semiconductor die 100E is adopted to be integrated in the circuit substrate 200B by a connecting film 162 inside the recess 112 formed at the second main surface S110b of the base substrate 110. The semiconductor die 160E is similar to the semiconductor die 160A, except a thickness of the semiconductor die 160E is greater than the thickness of the semiconductor die 160A along the direction Z, and thus the detail of the semiconductor die 160E is omitted. As shown in FIG. 21, for example, a sum of the thickness of the conductive blocks CB of the redistribution circuit structure 150 and a height H112 of the recess 112 is substantially equal to a sum of the thickness of the semiconductor die 160E and the thickness of the connecting film 162. In some embodiments, the height H112 of the recess 112 is approximately ranging from 50 μm to 500 μm. In some embodiments, a sidewall (not labeled) of the semiconductor die 160E is distant from a sidewall of the recess 112 by a gap GP, where the gap GP is approximately ranging from 60 μm to 200 μm. As illustrated in FIG. 21, the insulating encapsulation 170 is further filled the gap GP between the recess 112 and the semiconductor die 160E, for example. With the recess 112, even the semiconductor die (e.g. 100E) with large height is adopted in one circuit substrate (e.g. 200B), the overall thickness of the circuit substrate (e.g. 200B) can at least maintain the same.

The circuit structure 200B may be formed by the forming process of the circuit structure 100A in conjunction with the method of FIG. 22, except that the step 1040 of FIG. 22 as described in FIG. 8 is substituted by recessing the second main surface S110b of the base substrate 110 exposed by debonding the carrier C1 and the debond layer DB1 as described in FIG. 7; and thus, are not repeated herein for simplicity. After the recess 112 is formed at the second main surface S110B of the base substrate 110, the redistribution circuit structure 150, the semiconductor die 160E and the insulating encapsulation 170 are formed over the base substrate 110 to form the circuit substrate 200B. Although no conductive via 120 is shown to be positioned directly under the semiconductor die 160E within the recess 112, there may be one or more than one conductive via 120 directly under the semiconductor die 160E within the recess 112 in the circuit structure 200B with a height less than a height of other conductive via 120 outside the recess 112 in the circuit structure 200B. That is, for example, the one conductive via 120 directly under the semiconductor die 160E within the recess 112 has end surfaces being exposed by and substantially coplanar to a bottom surface of the recess 112 (e.g. a portion of the second main surface S110b within the recess 112). It is appreciated that the modifications to the circuit structure 100A may also be adopted by the circuit structure 200E, through with or without the conductive vias 120 directly under the semiconductor die 160E in the circuit structure 200B. Since the details of the modifications to the circuit structure 100A have been described in FIG. 12 and FIG. 16 through FIG. 19, the detailed descriptions are omitted herein for brevity.

Alternatively, if the recess 112 is adopted directly to the circuit substrate 200A without using semiconductor die with large height, the overall thickness of the circuit substrate 200A can be reduced.

In some embodiments, the circuit substrates 100A, 100B, 100C, 100D, 100E, 200A, 200B and the modifications as described above may be independently referred to as an interposer or an interposer substrate, where a semiconductor package may be formed by directly forming a sub-package thereon to obtain a semiconductor package having a stacked structure without any conductive joints, such as micro bumps or vias, solder balls, BGA balls, or the like between the interposer and a sub-package.

Figure 23:
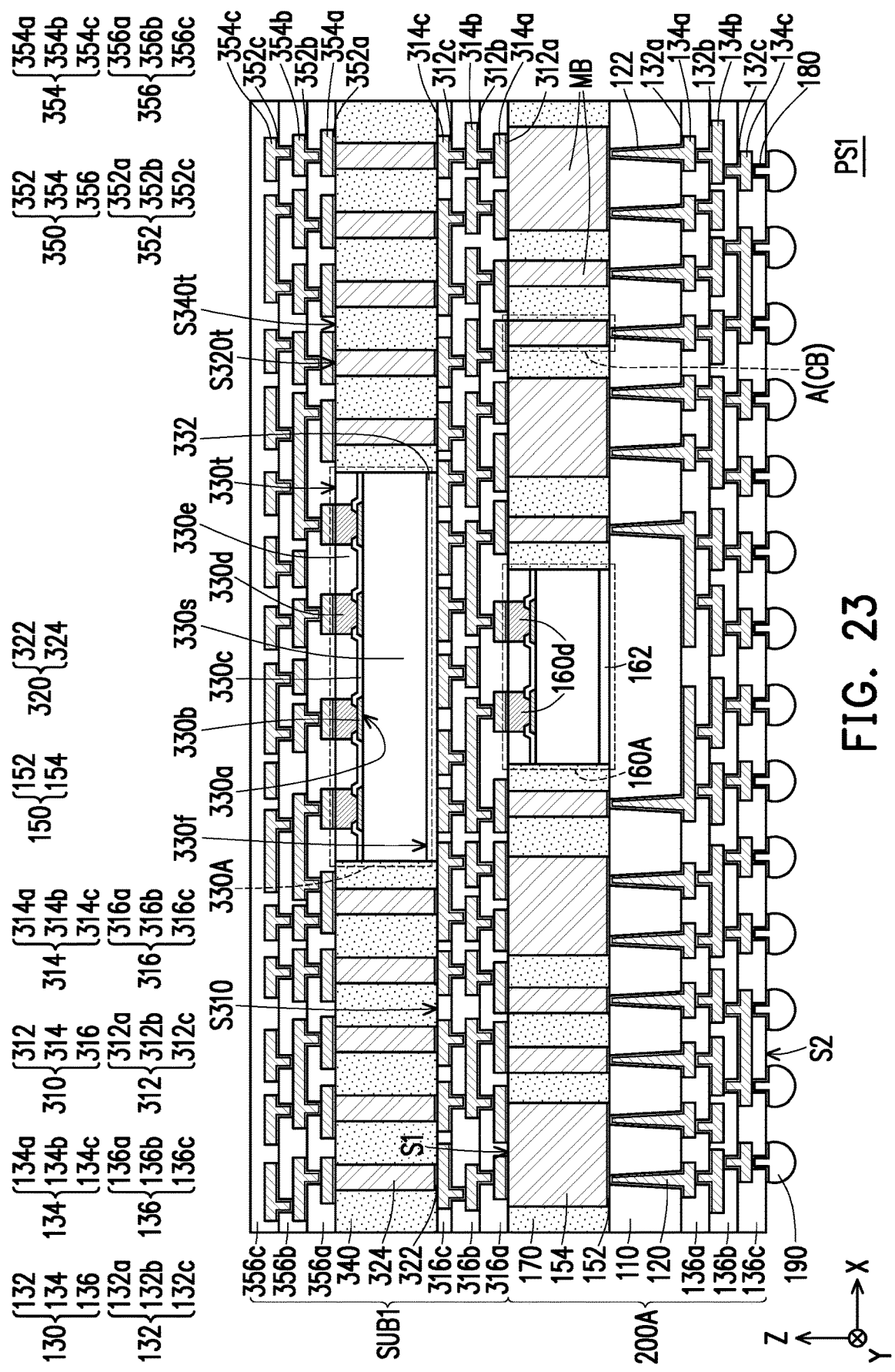
FIG. 23 is a schematic cross-sectional view showing a semiconductor package in accordance with some embodiments of the disclosure.

Referring to FIG. 23, in some embodiments, a package structure PS1 includes a circuit substrate 200A and a sub-package SUB1 formed on the circuit substrate 200A. The detail of the circuit substrate 200A has been described in FIG. 20, and thus is not repeated therein for simplicity. In some embodiments, the sub-package SUB1 includes a redistribution circuit structure 310, a plurality of conductive vias 320, a semiconductor die 330, an insulating encapsulation 340 and a redistribution circuit structure 350. For example, as shown in FIG. 23, in the package structure PS1, the redistribution circuit structure 310 of the sub-package SUB1 is located on the first side S1 of the circuit substrate 200A, and the conductive vias 320 and the semiconductor die 330 are located on and electrically connected to the redistribution circuit structure 310, where the conductive vias 320 and the semiconductor die 330 are encapsulated in the insulating encapsulation 340. Top surfaces S320t of the conductive vias 320 and a top surface 330t of the semiconductor die 330 are substantially leveled with and coplanar to a top surface S340t of insulating encapsulation 340, as shown in FIG. 23, for example. In some embodiments, the redistribution circuit structure 350 is located on the top surface S340t of insulating encapsulation 340 and electrically connected to the conductive vias 320 and the semiconductor die 330.

Figure 25:
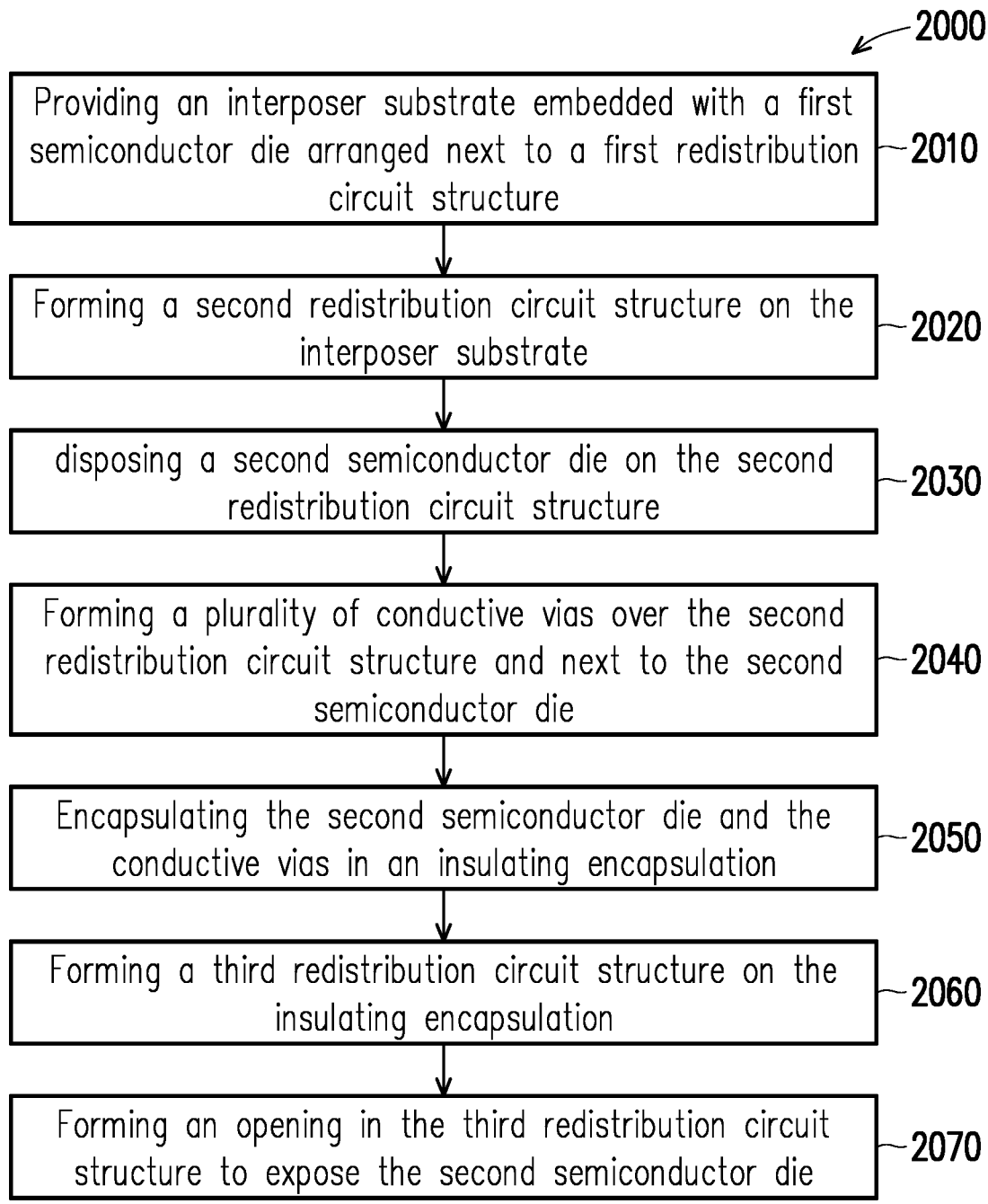
FIG. 25 is a flow chart illustrating a method of manufacturing a semiconductor package in accordance with some embodiments of the disclosure.

The package structure PS1 may be formed by, but not limited to, steps 2010, 2020, 2030, 2040, 2050, and 2060 of a method 2000 in FIG. 25. It should be understood that additional processing may occur before, during, and after the illustrated actions of the method 2000 of FIG. 25 to complete formation of the package structure PS1.

In some embodiments, the circuit substrate 200A of FIG. 20 is provided, in accordance with the step 2010 of FIG. 25.

For example, the circuit substrate 200A may serve as an interposer or an interposer substrate. In some embodiments, the circuit substrate 200A is provided and placed on another carrier (not shown) for facilitating the sequential processes of the method 2000. The material of the carrier may be the same or similar to the carrier C1 as described in FIG. 1 or the carrier C2 as described in FIG. 7.

In some embodiments, the redistribution circuit structure 310 is formed on the circuit substrate 200A, in accordance with the step 2020 of FIG. 25. For example, the redistribution circuit structure 310 is formed on the first side S1 of the circuit substrate 200A, where the redistribution circuit structure 310 includes one or more than one seed layer 312 (e.g. the seed layer 312a, a seed layer 312b, and a seed layer 312c), one or more than one metallization layer 314 (e.g. the metallization layer 314a, a metallization layer 314b, and a metallization layer 314c), and one or more than one dielectric layer 316 (e.g. a dielectric layer 316a, a dielectric layer 316b, and a dielectric layer 316c). In some embodiments, the redistribution circuit structure 310 is electrically connected to the redistribution circuit structure 150 and the semiconductor die 160A of the circuit board 200A by direct connect. That is, the seed layer 312a connecting to the metallization layer 314a and exposed by the dielectric layer 316a is physically and electrically connected to the conductive blocks CB of the redistribution circuit structure 150 and the conductive vias 160d of the semiconductor die 160A. However, in the disclosure, the numbers of layers of the seed layers 312, the metallization layers 314, and the dielectric layers 316 are not limited to what is depicted in FIG. 23, and may be selected or designated based on the demand and/or design layout. The formations and material of the redistribution circuit structure 310 are substantially identical or similar to the forming process and material of the redistribution circuit structure 130 as described in FIG. 6, and thus are not repeated herein for brevity.

In some embodiments, the semiconductor die 330 is disposed on the redistribution circuit structure 310, in accordance with the step 2030 of FIG. 25. For example, the semiconductor die 330 is picked and placed over the surface S310 of the redistribution circuit structure 310, where a connecting film 332 is located between the backside surface 330f of the semiconductor die 330 and the surface S310 of the redistribution circuit structure 310 for adhering the semiconductor die 330 onto the redistribution circuit structure 310. Due to the connecting film 332, the adhesive strength between the semiconductor die 330 onto the redistribution circuit structure 310 is enhanced. For simplification, only one semiconductor die 330 is presented in FIG. 23 for illustrative purposes. However, it should be noted that more than one semiconductor die 330 may be formed; the disclosure is not limited thereto. The number of the semiconductor die 330 can be selected based on the demand.

In some embodiments, the semiconductor die 330 includes a semiconductor substrate 330s having an active surface 330a and the backside surface 330f opposite to the active surface 330a, a plurality of pads 330b distributed on the active surface 330a, a passivation layer 330c covering the active surface 330a and a portion of the pads 330b, a plurality of conductive vias 330d connecting to the pads 330b exposing by the passivation layer 330c, and a protection layer 330e disposed on the passivation layer 330c and wrapping around the conductive vias 330d. The formations and materials of the semiconductor substrate 330s, pads 330b, the passivation layer 330c, the conductive vias 330d and the protection layer 330e are substantially identical or similar to the formations and materials of the semiconductor substrate 160s, the pads 160b, the passivation layer 160c, the conductive vias 160d and the protection layer 160e as described in FIG. 9, and thus are not repeated herein for simplicity. Alternatively, the conductive vias 330d and the protection layer 330e may be omitted.

In some embodiments, the conductive vias 320 are formed on the redistribution circuit structure 310, in accordance with the step 2040 of FIG. 25. For example, the conductive vias 320 are formed on the surface S310 of the redistribution circuit structure 310. As shown in FIG. 23, the conductive vias 320 are arranged aside of the semiconductor die 330 on the X-Y plane. In some embodiments, the conductive vias 320 are through integrated fan-out (info) vias. In certain embodiments, the conductive vias 320 are arranged along but not on a cutting line (not shown) between two package structures PS1. In one embodiment, the material of the conductive vias 320 may include a metal material such as copper or copper alloys, or the like. In one embodiment, the conductive vias 320 may be formed after disposing the semiconductor die 330 on the redistribution circuit structure 310, however the disclosure is not limited thereto. However, the disclosure is not limited thereto. In an alternative embodiment, the conductive vias 320 may be formed prior to disposing the semiconductor die 330 on the redistribution circuit structure 310.

In some embodiment, the conductive vias 320 may be formed by forming a seed layer material (not shown) on the redistribution circuit structure 310; forming the mask pattern (not shown) with openings exposing portions of the seed layer material; forming the metallic material on the exposed portions of the seed layer material to form the conductive material 324 by plating; removing the mask pattern; and then removing portions of the seed layer material exposed by using the conductive material 324 as an etching mask to form a seed layer 322, thereby forming the conductive vias 320 including the seed layer 322 and the conductive material 324 overlying thereto. For example, the seed layer 322 may be a titanium/copper composited layer. The material of the mask pattern may include a positive photo-resist or a negative photo-resist. However, the disclosure is not limited thereto. For simplification, only ten conductive vias 320 are presented in FIG. 23 for illustrative purposes. However, it should be noted that less or more than ten conductive vias 320 may be formed; the disclosure is not limited thereto. The number of the conductive vias 320 can be selected based on the demand.

In alternative embodiments, the conductive vias 320 are formed by photolithography, plating, photoresist stripping processes or any other suitable method. In one embodiment, the conductive vias 320 may be formed by forming a mask pattern having openings (not shown), where the mask pattern covers a portion of redistribution circuit structure 310 and exposes another portion of redistribution circuit structure 310 with the openings; forming a metallic material to fill the openings so as to form the conductive vias 320 by electroplating or deposition; and then removing the mask pattern. In such alternative embodiments, the seed layer 322 may be omitted.

In some embodiments, the conductive vias 320 and the semiconductor die 330 are encapsulated in an insulating encapsulation 340, in accordance with the step 2050 of FIG. 25. The formation and material of the insulating encapsulation 340 is substantially identical or similar to the forming process and material of the insulating encapsulation 170m/170 as described in FIG. 10 and FIG. 11, and thus are not repeated herein for brevity. As shown in FIG. 23, for example, the conductive vias 330d of the semiconductor die 330 and the conductive vias 320 are accessibly revealed by the insulating encapsulation 340.

In some embodiments, the redistribution circuit structure 350 is formed on the insulating encapsulation 340, in accordance with the step 2060 of FIG. 25. For example, the redistribution circuit structure 350 is formed on the top surface S340t of the insulating encapsulation 340, the top surface 330t of the semiconductor die 330 and the top surfaces S320t of the conductive vias 320, where the redistribution circuit structure 350 is electrically connected to the semiconductor die 330 through the conductive vias 330d and is electrically connected to the conductive vias 320. In some embodiments, the redistribution circuit structure 350 includes one or more than one seed layer 352 (e.g. the seed layer 352a, a seed layer 352b, and a seed layer 352c), one or more than one metallization layer 354 (e.g. the metallization layer 354a, a metallization layer 354b, and a metallization layer 354c), and one or more than one dielectric layer 356 (e.g. a dielectric layer 356a, a dielectric layer 356b, and a dielectric layer 356c). Through the redistribution circuit structure 350, some of the conductive vias 320 are electrically connected to the semiconductor die 330, for example. Through the redistribution circuit structure 350, some of the conductive vias 320, the redistribution circuit structure 310, the redistribution circuit structure 150 (e.g. some of the conductive blocks CB), some of the conductive vias 120 and the redistribution circuit structure 130, some of the conductive terminals 190 are electrically connected to the semiconductor die 330, for example. Through the redistribution circuit structure 350, some of the conductive vias 320 and the redistribution circuit structure 310, the semiconductor die 330 is electrically connected to and electrically communicated to the semiconductor die 100A, for example. However, in the disclosure, the numbers of layers of the seed layers 352, the metallization layers 354, and the dielectric layers 356 are not limited to what is depicted in FIG. 23, and may be selected or designated based on the demand and/or design layout. The formations and material of the redistribution circuit structure 350 are substantially identical or similar to the forming process and material of the redistribution circuit structure 130 as described in FIG. 6, and thus are not repeated herein for brevity.

In some embodiments, a dicing (singulation) process is performed to cut through the redistribution circuit structure 350, the insulating encapsulation 340, the redistribution circuit structure 310, the redistribution circuit structure 150, the circuit substrate 200A and the redistribution circuit structure 130 to form individual and separated package structures PS1. In some embodiments, before dicing (singulation) process, a debonding process is performed to remove the carrier form the package structures PS1. In one embodiment, the debonding process is a laser debonding process. During the debonding step, a holding device (not shown) may be adopted to secure the package structures PS1 before debonding the carrier. For example, the holding device may be an adhesive tape, a carrier film or a suction pad. The disclosure is not limited thereto.

Up to here, the package structure PS1 is manufactured. As shown in FIG. 23, for example, a sidewall of the redistribution circuit structure 350, a sidewall of the insulating encapsulation 340, a sidewall of the redistribution circuit structure 310, a sidewall of the redistribution circuit structure 150, a sidewall of the circuit substrate 200A and a sidewall of the redistribution circuit structure 130 are substantially aligned to each other. In this disclosure, the sidewall of the redistribution circuit structure 350, the sidewall of the insulating encapsulation 340, the sidewall of the redistribution circuit structure 310, the sidewall of the redistribution circuit structure 150, the sidewall of the circuit substrate 200A and the sidewall of the redistribution circuit structure 130 are collectively referred to as a sidewall of the package structure PS1.

Alternatively, instead of providing a circuit substrate with conductive terminals (e.g. 190) disposed thereon in the formation of the package structure PS1, a circuit substrate without conductive terminals (e.g. 190) may be provided, such as the structure depicted in FIG. 11, in the step 2010 of the method 2000 in FIG. 25. With such embodiments, prior to the dicing (singulation) process and after the debonding process, the conductive terminals (e.g. 190) are disposed on the redistribution circuit structure 130.

In some embodiments, as shown in FIG. 23, the semiconductor die 330 described herein is referred as a semiconductor chip or an IC, for example. In an alternative embodiment, the semiconductor die 330 described herein may be a semiconductor device. In some embodiments, the semiconductor die 330 includes a digital chip, an analog chip or a mixed signal chip, such as an ASIC chip, a sensor chip, a wireless and RF chip, a memory chip, a logic chip or a voltage regulator chip. The logic chip may include a CPU, a GPU, a SoC, a microcontroller, or the like. The memory chip may include a memory chip or device, such as a DRAM die, a SRAM die, an HMC module, an HBM module, or the like. In certain embodiments, additional semiconductor die (s) of the same type or different types may be included. The additional semiconductor die(s) may include digital chips, analog chips or mixed signal chips, such as ASIC chips, sensor chips, wireless and RF chips, memory chips, logic chips or voltage regulator chips. In alternative embodiments, the semiconductor die 330 may be referred to as a chip or an IC of combination-type, such as a WiFi chip simultaneously including both of a RF chip and a digital chip.

The disclosure is not limited thereto. Alternatively, the semiconductor die 330 may be substituted by a photo/image sensor chip or the like. For example, a package structure PS2 of FIG. 24 and the package structure PS1 of FIG. 23 are similar; the difference is that, a semiconductor die 360 having a sensor device 360p is adopted to be molded in the insulating encapsulation 340 and next to the conductive vias 320, instead. In some embodiments, the package structure PS2 includes a circuit substrate 200A and a sub-package SUB2 formed on the circuit substrate 200A. In some embodiments, the sub-package SUB2 includes a redistribution circuit structure 310, a plurality of conductive vias 320, a semiconductor die 360, an insulating encapsulation 340 and a redistribution circuit structure 350. The detail of the circuit substrate 200A has been described in FIG. 20, the details of the redistribution circuit structure 310, the conductive vias 320, the insulating encapsulation 340 and the redistribution circuit structure 350 have been described in FIG. 23, and thus are not repeated therein for simplicity.

Figure 24:
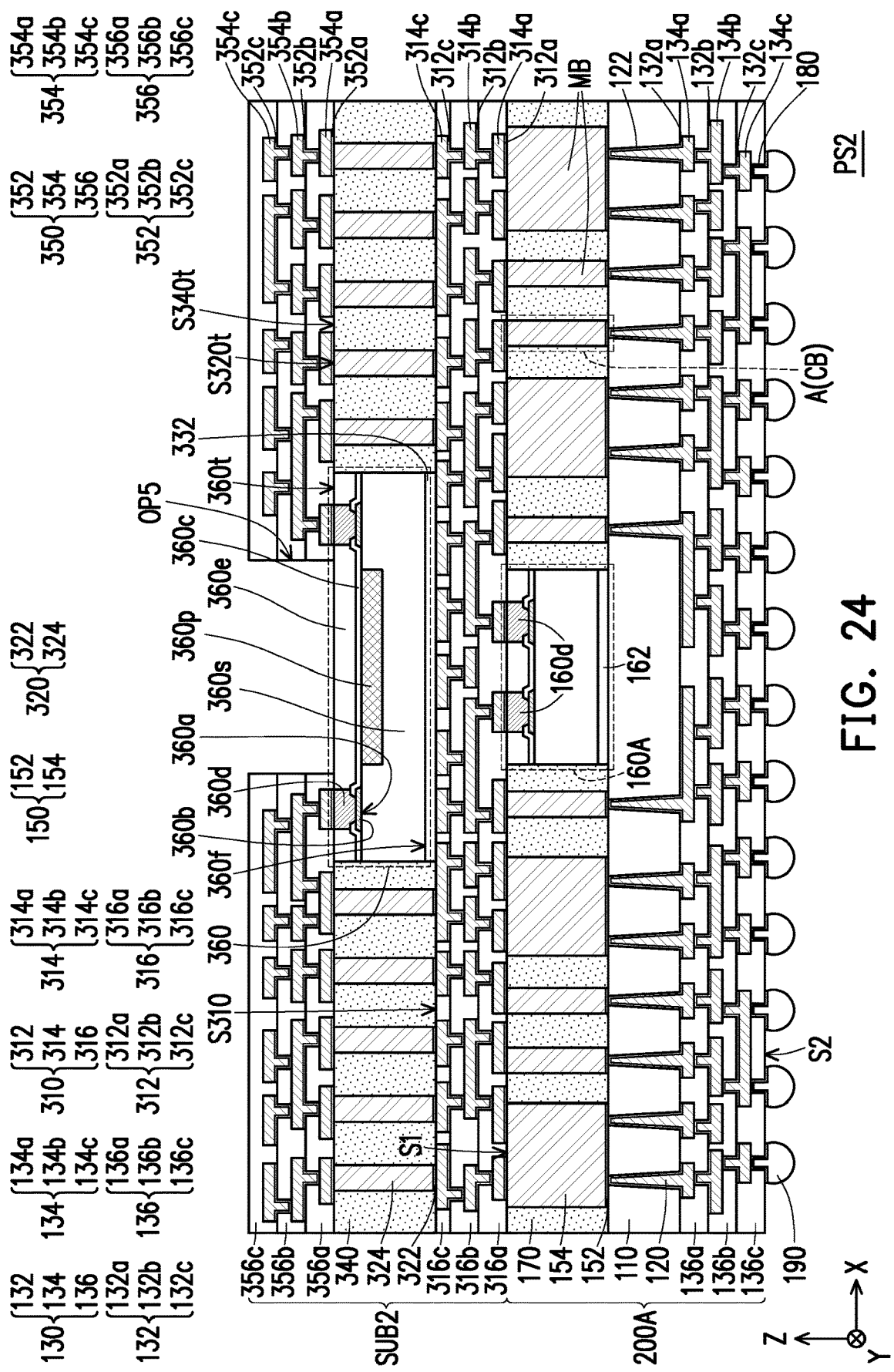
FIG. 24 is a schematic cross-sectional view showing a semiconductor package in accordance with some alternative embodiments of the disclosure.

In some embodiments, as shown in FIG. 24, in the package structure PS2, the redistribution circuit structure 310 of the sub-package SUB2 is located on the first side S1 of the circuit substrate 200A, and the conductive vias 320 and the semiconductor die 360 are located on and electrically connected to the redistribution circuit structure 310, where the conductive vias 320 and the semiconductor die 360 are encapsulated in the insulating encapsulation 340. Top surfaces S320t of the conductive vias 320 and a top surface 360t of the semiconductor die 360 are substantially leveled with and coplanar to a top surface S340t of insulating encapsulation 340, as shown in FIG. 24, for example. The semiconductor die 360 is bonded to the redistribution circuit structure 310 through a connecting film 362. In some embodiments, the redistribution circuit structure 350 is located on the top surface S340t of insulating encapsulation 340 and electrically connected to the conductive vias 320 and the semiconductor die 360. In some embodiments, as shown in FIG. 24, an opening OP5 is formed in the redistribution circuit structure 350 over the semiconductor die 360. For example, in a vertical projection on the circuit substrate 200A along the direction Z, the positioning location of the opening OP5 is overlapped with a positioning location of sensor device 360p. In other words, in the vertical projection, the positioning location of the opening OP5 is greater than or substantially equal to the positioning location of sensor device 360p embedded in the semiconductor die 360.

In some embodiments, the semiconductor die 360 includes a semiconductor substrate 360s having an active surface 360a and the backside surface 360f opposite to the active surface 360a, a plurality of pads 360b distributed on the active surface 360a, a passivation layer 360c covering the active surface 360a and a portion of the pads 360b, a plurality of conductive vias 360d connecting to the pads 360b exposing by the passivation layer 330c, a protection layer 360e disposed on the passivation layer 360c and wrapping around the conductive vias 360d, a sensor device 360p located at the active surface 360a in the semiconductor substrate 360s. On the X-Y plane, for example, the pads 360b and the conductive vias 360d are arranged aside of the sensor device 360p, for example. In the disclosure, a region of the top surface 360t overlapped with the opening OP5 may be referred to as a sensor region, and a region of the top surface 360t without overlapped with the opening OP5 may be referred to as a device/circuit region.

The formations and materials of the semiconductor substrate 360s, pads 360b, the passivation layer 360c, the conductive vias 360d and the protection layer 360e are substantially identical or similar to the formations and materials of the semiconductor substrate 160s, the pads 160b, the passivation layer 160c, the conductive vias 160d and the protection layer 160e as described in FIG. 9, and thus are not repeated herein for simplicity. Alternatively, the conductive vias 360d and the protection layer 360e may be omitted.

For example, the sensor device 360p is electrically connected/communicated to the active components and/or the passive components through the interconnection structure of the semiconductor substrate 360s. On the other hand, the sensor device 360p may be electrically connected and communicated to the additional semiconductor die(s) through the interconnection structure and the conductive vias 360d of the semiconductor substrate 360s and later-formed connectors. For example, the sensor device 360p is configurated to convert light signals (photons) from a light source to electrical signals, where the electrically signals are transmitted to the active components and/or the passive components (and/or further to the additional semiconductor dies) for processing. In some embodiments, peripheral circuits (not shown) used for processing of the electrical signals from the sensor device 360p may be formed in the semiconductor substrate 360s of the semiconductor die 360 (and/or the additional semiconductor die, if any). The peripheral circuits may include image signal processing (ISP) circuits which including analog-to-digital converters (ADCs), correlated double sampling (CDS) circuits, row decoders and the like. For example, the peripheral circuits may be part of the active components and/or the passive components, or a component separated from and electrically connected to the active components and/or the passive components of the semiconductor die 360 (and/or the additional semiconductor die, if any), the disclosure is not limited thereto.

The sensor device 360p may include an image sensor, such as a photo-sensitive metal-oxide-semiconductor (MOS) transistor or a photo-sensitive diode. For example, the sensor device 360p include a photo-sensitive diode (or saying photo diode). However, the disclosure is not limited there, and in an alternative embodiment, the sensor device 360p may be an image sensor of other types. For example, only one sensor device 360p is shown for illustrative purposes, however the number of the sensor device 360p is not limited thereto.

The package structure PS2 may be formed by, but not limited to, steps 2010, 2020, 2030, 2040, 2050, 2060 and 2070 of the method 2000 in FIG. 25. It should be understood that additional processing may occur before, during, and after the illustrated actions of the method 2000 of FIG. 25 to complete formation of the package structure PS2. For example, after forming the redistribution circuit structure 350 on the insulating encapsulation (step 2060 of FIG. 25), the redistribution circuit structure 350 is patterned to form the opening OP2 over the sensor device 360p (step 2070 of FIG. 25). The patterning process may include photolithography and etching processes. The etching process may include a dry etching, a wet etching, or a combination thereof.

In some embodiments, the circuit substrate 200A included the package structures PS1 and the circuit substrate 200A included the package structures PS1 can be substituted by the circuit substrate 100A of FIG. 12, the circuit substrate 100B of FIG. 16, the circuit substrate 100C of FIG. 17, the circuit substrate 100D of FIG. 18, the circuit substrate 100E of FIG. 19, or the circuit substrate 200B of FIG. 21, or their modifications as described above. The disclosure is not limited thereto. In the disclosure, a package structure adopting the circuit substrate disclosed herein has a lower resistance and better heat dissipation capability.

In accordance with some embodiments, a circuit substrate includes a base substrate, a plurality of conductive vias, a first redistribution circuit structure, a second redistribution circuit structure and a semiconductor die. The plurality of conductive vias penetrate through the base substrate. The first redistribution circuit structure is located on the base substrate and connected to the plurality of conductive vias. The second redistribution circuit structure is located over the base substrate and electrically connected to the plurality of conductive vias, where the second redistribution circuit structure includes a plurality of conductive blocks, and at least one of the plurality of conductive blocks is electrically connected to two or more than two of the plurality of conductive vias, and where the base substrate is located between the first redistribution circuit structure and the second redistribution circuit structure. The semiconductor die is located over the base substrate and laterally arranged next to the second redistribution circuit structure.

In accordance with some embodiments, a circuit substrate includes a base substrate, a plurality of first conductive vias, a first redistribution circuit structure, metallization blocks, a first semiconductor die and a first insulating encapsulation. The base substrate has a first side and a second side opposite to the first side. The plurality of first conductive vias penetrate through the base substrate. The first redistribution circuit structure is located on the first side of the base substrate and connected to the plurality of first conductive vias. The metallization blocks are located on the second side of the base substrate and in contact with the plurality of first conductive vias. The first semiconductor die is located on the second side of the base substrate and laterally arranged next to the metallization blocks. The first insulating encapsulation encapsulates the metallization blocks and the first semiconductor die.

In accordance with some embodiments, a method of manufacturing a circuit substrate includes the following steps: providing a base substrate; forming a plurality of first conductive vias penetrating through the base substrate; forming a first redistribution circuit structure on the base substrate to connect with the plurality of first conductive vias; forming a second redistribution circuit structure comprising a plurality of conductive blocks on the base substrate, at least one of the plurality of conductive blocks being electrically connected to two or more than two of the plurality of first conductive vias, and the base substrate being between the first redistribution circuit structure and the second redistribution circuit structure; and disposing a first semiconductor die on the base substrate and laterally arranged next to the second redistribution circuit structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A circuit substrate, comprising:
   a base substrate;
   a plurality of conductive vias, penetrating through the base substrate;
   a first redistribution circuit structure, located on the base substrate and connected to the plurality of conductive vias;
   a second redistribution circuit structure, located over the base substrate and electrically connected to the plurality of conductive vias, wherein the second redistribution circuit structure comprises a plurality of conductive blocks, and at least one of the plurality of conductive blocks is electrically connected to two or more than two of the plurality of conductive vias, and wherein the base substrate is located between the first redistribution circuit structure and the second redistribution circuit structure; and
   a semiconductor die, located over the base substrate and laterally arranged next to the second redistribution circuit structure.

2. The circuit substrate of claim 1, further comprising:
   an insulating encapsulation, encapsulating the semiconductor die and the second redistribution circuit structure, wherein a surface of the insulating encapsulation is substantially coplanar with surfaces of the plurality of conductive blocks.

3. The circuit substrate of claim 2, wherein the surface of the insulating encapsulation is substantially coplanar with a surface of the semiconductor die.

4. The circuit substrate of claim 1, wherein the semiconductor die is located on the base substrate through an adhesive layer, and a thickness of the plurality of conductive blocks is substantially equal to a sum of a thickness of the semiconductor die and a thickness of the adhesive layer.

5. The circuit substrate of claim 1, wherein the semiconductor die is adhered to the base substrate through an adhesive layer placed into a recess formed in the base substrate,
   wherein a sum of a thickness of any one of the plurality of conductive blocks and a height of the recess is substantially equal to a sum of a thickness of the semiconductor die and a thickness of the adhesive layer.

6. The circuit substrate of claim 1, wherein the semiconductor die is connected to the plurality of conductive vias through conductive joints.

7. The circuit substrate of claim 6, wherein surfaces of the plurality of conductive blocks are substantially coplanar with a surface of the semiconductor die.

8. The circuit substrate of claim 1, wherein the semiconductor die is the lowermost die of a die stack, wherein the die stack comprises two or more than two semiconductor dies stacked on and electrically connected to one another along a stacking direction of the base substrate and the first redistribution circuit structure.

9. The circuit substrate of claim 1, wherein the semiconductor die is one of a set of coplanar dies, and the set of the coplanar dies are arranged next to each other along a direction perpendicular to a stacking direction of the base substrate and the first redistribution circuit structure.

10. The circuit substrate of claim 1, further comprising:
    a third redistribution circuit structure, located between and electrically connected to the plurality of conductive vias and the second redistribution circuit structure, wherein the second redistribution circuit structure is electrically connected to the first redistribution circuit structure through the third redistribution circuit structure and the plurality of conductive vias.

11. The circuit substrate of claim 10, wherein a thickness of the third redistribution circuit structure is less than a thickness of the first redistribution circuit structure along a stacking direction of the base substrate and the first redistribution circuit structure.

12. A circuit substrate, comprising:
    a base substrate having a first side and a second side opposite to the first side;
    a plurality of first conductive vias, penetrating through the base substrate;
    a first redistribution circuit structure, located on the first side of the base substrate and connected to the plurality of first conductive vias;
    metallization blocks, located on the second side of the base substrate and in contact with the plurality of first conductive vias;
    a first semiconductor die, located on the second side of the base substrate and laterally arranged next to the metallization blocks; and
    a first insulating encapsulation, encapsulating the metallization blocks and the first semiconductor die, wherein a sidewall of the first insulating encapsulation is substantially aligned with a sidewall of the base substrate.

13. The circuit substrate of claim 12, wherein along a stacking direction of the base substrate and the first redistribution circuit structure, a shape of a cross-section of the metallization blocks comprises a square shape, a rectangular shape, or trapezoidal shape, wherein the circuit substrate further comprises:
a second redistribution circuit structure, located on the second side of the base substrate and disposed between the first insulating encapsulation and the base substrate.

14. The circuit substrate of claim 12, wherein along a direction perpendicular to a stacking direction of the base substrate and the first redistribution circuit structure, a shape of a top view of the metallization blocks comprises a circular shape, a tetragonal shape, or polygonal shape.

15. The circuit substrate of claim 12, wherein at least one of the metallization blocks comprises a first portion, a second portion, and a third portion connecting to the first portion and the second portion along a direction perpendicular to a stacking direction of the base substrate and the first redistribution circuit structure,
wherein in a plane view of the circuit substrate, along a direction perpendicular to an extending direction of the third portion, a maximum dimension of the third portion is less than a maximum dimension of the first portion and is less than a maximum dimension of the second portion.

16. A package structure, comprising:
a circuit substrate as claimed in claim 12;
a second redistribution circuit structure, located on and in contact with the first insulating encapsulation and electrically connected to the metallization blocks and the first semiconductor die;
a second semiconductor die, located on and electrically connected to the second redistribution circuit structure;
second conductive vias, located on and electrically connected to the second redistribution circuit structure and arranged next to the second semiconductor die;
a second insulating encapsulation, encapsulating the second semiconductor die and the second conductive vias; and
a third redistribution circuit structure, located on and electrically connected to the second semiconductor die and the second conductive vias, wherein the first semiconductor die and the second semiconductor die are electrically coupled,
wherein the second insulating encapsulation is sandwiched between the second redistribution circuit structure and the third redistribution circuit structure, and the first insulating encapsulation is sandwiched between the second redistribution circuit structure and the base substrate.

17. A method of manufacturing a circuit substrate, comprising:
providing a base substrate;
forming a plurality of first conductive vias penetrating through the base substrate;
forming a first redistribution circuit structure on the base substrate to connect with the plurality of first conductive vias;
forming a second redistribution circuit structure comprising a plurality of conductive blocks on the base substrate, at least one of the plurality of conductive blocks being electrically connected to two or more than two of the plurality of first conductive vias, and the base substrate being between the first redistribution circuit structure and the second redistribution circuit structure; and
disposing a first semiconductor die on the base substrate and laterally arranged next to the second redistribution circuit structure.

18. The method of claim 17,
wherein prior to forming the second redistribution circuit structure and prior to disposing the first semiconductor die, the method further comprises forming an additional redistribution circuit structure on the base substrate, and the second redistribution circuit structure is electrically connected to the first conductive vias through the additional redistribution circuit structure, and/or
wherein after forming the second redistribution circuit structure and after disposing the first semiconductor die, the method further comprises encapsulating the second redistribution circuit structure and the first semiconductor die in a first insulating encapsulation.

19. The method of claim 17, further comprising:
forming a sub-package over the base substrate, comprising:
forming a third redistribution circuit structure over the second redistribution circuit structure and the first semiconductor die, the third redistribution circuit structure being in contact with the first insulating encapsulation;
disposing a second semiconductor die on the third redistribution circuit structure;
forming a plurality of second conductive vias on the third redistribution circuit structure and next to the second semiconductor die, the third redistribution circuit structure being electrically connected to the plurality of second conductive vias;
encapsulating the second semiconductor die and the plurality of second conductive vias in the second insulating encapsulation; and
forming a fourth redistribution circuit structure over the second insulating encapsulation, the fourth redistribution circuit structure being electrically connected to the plurality of second conductive vias and the second semiconductor die, and the second semiconductor die being electrically communicated with the first semiconductor die.

20. The method of claim 19, further comprising:
patterning the fourth redistribution circuit structure to form an opening exposing the second semiconductor die.

* * * * *